US012757375B2

(12) United States Patent
Su

(10) Patent No.: US 12,757,375 B2
(45) Date of Patent: Oct. 6, 2026

(54) ASSEMBLY STRUCTURE INCLUDING A PLURALITY OF SPACERS AND METHOD OF MANUFACTURING THE SAME

(71) Applicant: NANYA TECHNOLOGY CORPORATION, New Taipei City (TW)

(72) Inventor: Pin-Yuan Su, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 362 days.

(21) Appl. No.: 18/539,609

(22) Filed: Dec. 14, 2023

(65) Prior Publication Data

US 2025/0174459 A1 May 29, 2025

Related U.S. Application Data

(62) Division of application No. 18/518,728, filed on Nov. 24, 2023.

(51) Int. Cl.

*H10B 12/00* (2023.01)
*H10P 50/00* (2026.01)
*H10P 76/40* (2026.01)

(52) U.S. Cl.

CPC ....... *H10B 12/0387* (2023.02); *H10P 50/695* (2026.01); *H10P 50/73* (2026.01); *H10P 76/4085* (2026.01)

(58) Field of Classification Search

CPC ... H10B 12/0387; H10B 12/02; H10P 50/695; H10P 50/73; H10P 76/4085; H10P 50/693; H10P 50/242; H10P 50/266; H10P 50/283; H10P 50/71

USPC .......................................................... 438/702

See application file for complete search history.

(56) References Cited

U.S. PATENT DOCUMENTS

| | | | | |
|---|---|---|---|---|
| 8,871,651 | B1 * | 10/2014 | Choi | H10P 50/695 438/724 |
| 9,236,481 | B1 * | 1/2016 | Zang | H10P 50/695 |
| 10,475,648 | B1 * | 11/2019 | Feng | H10P 50/695 |

(Continued)

FOREIGN PATENT DOCUMENTS

| | | |
|---|---|---|
| TW | 200939301 A | 9/2009 |
| TW | 201123264 A | 7/2011 |

(Continued)

OTHER PUBLICATIONS

Office Action and and the search report mailed on Jan. 14, 2025 related to Taiwanese Application No. 113103733.

(Continued)

*Primary Examiner* — Mohammad M Hoque
(74) *Attorney, Agent, or Firm* — Xuan Zhang

(57) ABSTRACT

An assembly structure including a plurality of spacers, and a method of manufacturing the same are provided. The assembly structure includes a base material and a plurality of spacers disposed over the base material. Each of the plurality of spacers has a first lateral surface and a second lateral surface opposite to the first lateral surface. The second lateral surface is substantially parallel with the first lateral surface. A ratio of a height of the second lateral surface to a height of the first lateral surface is greater than 90%.

15 Claims, 28 Drawing Sheets

(56) References Cited

U.S. PATENT DOCUMENTS

| | | | | |
|---|---|---|---|---|
| 2008/0076071 | A1* | 3/2008 | Lim | H10P 50/73 430/311 |
| 2008/0200026 | A1* | 8/2008 | Koh | H10W 20/089 438/643 |
| 2015/0014772 | A1* | 1/2015 | Cheng | H10P 50/695 257/347 |
| 2019/0252187 | A1 | 8/2019 | Lin et al. | |
| 2019/0318929 | A1* | 10/2019 | Chuang | H10P 50/695 |
| 2020/0075334 | A1 | 3/2020 | Schenker et al. | |
| 2022/0285162 | A1* | 9/2022 | Kang | H10P 76/4085 |

FOREIGN PATENT DOCUMENTS

| | | | |
|---|---|---|---|
| TW | 201349392 | A | 12/2013 |
| TW | 201503228 | A | 1/2015 |
| TW | 201807513 | A | 3/2018 |
| TW | 202135138 | A | 9/2021 |
| TW | 202139421 | A | 10/2021 |

OTHER PUBLICATIONS

Office Action and and the search report mailed on Jan. 9, 2025 related to Taiwanese Application No. 113121199.

Summary translation of Office Action and and the search report mailed on Jan. 14, 2025 related to Taiwanese Application No. 113103733 and Summary translation of Office Action and and the search report mailed on Jan. 9, 2025 related to Taiwanese Application No. 113121199.

* cited by examiner

ASSEMBLY STRUCTURE INCLUDING A PLURALITY OF SPACERS AND METHOD OF MANUFACTURING THE SAME

CROSS-REFERENCE TO RELATED APPLICATION

This application is a divisional application of U.S. Non-Provisional application Ser. No. 18/518,728 filed Nov. 24, 2023, which is incorporated herein by reference in its entirety.

TECHNICAL FIELD

The present disclosure relates to an assembly structure and a method of manufacturing the same, and more particularly, to an assembly structure including a plurality of spacers, and a method of manufacturing the same.

DISCUSSION OF THE BACKGROUND

Semiconductor structures are used in a variety of electronic applications, and the dimensions of semiconductor structures are continuously being scaled down to meet the current application requirements. However, a variety of issues arise during the scaling-down process and impact the final electrical characteristics, quality, cost and yield. Typical memory devices (such as dynamic random access memory (DRAM) devices) include a plurality of openings or trenches formed by using a plurality of spacers as mask. As DRAM devices are scaled down and the dimensions and/or pitches of the openings or trenches are getting smaller, the spacers will be a critical concern.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides an assembly structure including a plurality of spacers. The assembly structure includes a base material and a plurality of spacers disposed over the base material. Each of the plurality of spacers has a first lateral surface and a second lateral surface opposite to the first lateral surface. The second lateral surface is substantially parallel with the first lateral surface. A ratio of a height of the second lateral surface to a height of the first lateral surface is greater than 90%.

Another aspect of the present disclosure provides a method of manufacturing a plurality of spacers. The method includes: providing a base material; forming a plurality of units over the base material, wherein each of the plurality of units includes an under layer (UL) and a hard mask (HM) on the under layer (UL); forming a cover layer to cover the units, wherein the cover layer includes a plurality of first portions disposed on top surfaces of the plurality of units, a plurality of second portions disposed on lateral surfaces of the plurality of units, and a plurality of third portions connecting the plurality of second portions; forming an upper material to cover the cover layer; removing the upper material and the plurality of first portions of the cover layer; removing the hard mask (HM) and the plurality of third portions of the cover layer; and removing the under layer (UL) to form a plurality of spacers, wherein each of the plurality of spacers has a first lateral surface and a second lateral surface opposite to the first lateral surface, the second lateral surface is substantially parallel with the first lateral surface, and a ratio of a height of the second lateral surface to a height of the first lateral surface is greater than 90%.

Another aspect of the present disclosure provides a method of manufacturing a plurality of openings in a base material. The method includes: providing a base material; forming a plurality of spacers over the base material, wherein each of the plurality of spacers has a first lateral surface and a second lateral surface opposite to the first lateral surface, the second lateral surface is substantially parallel with the first lateral surface, and a ratio of a height of the second lateral surface to a height of the first lateral surface is greater than 90%; and forming a plurality of openings in the base material by using the plurality of spacers as a plurality of mask structures.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
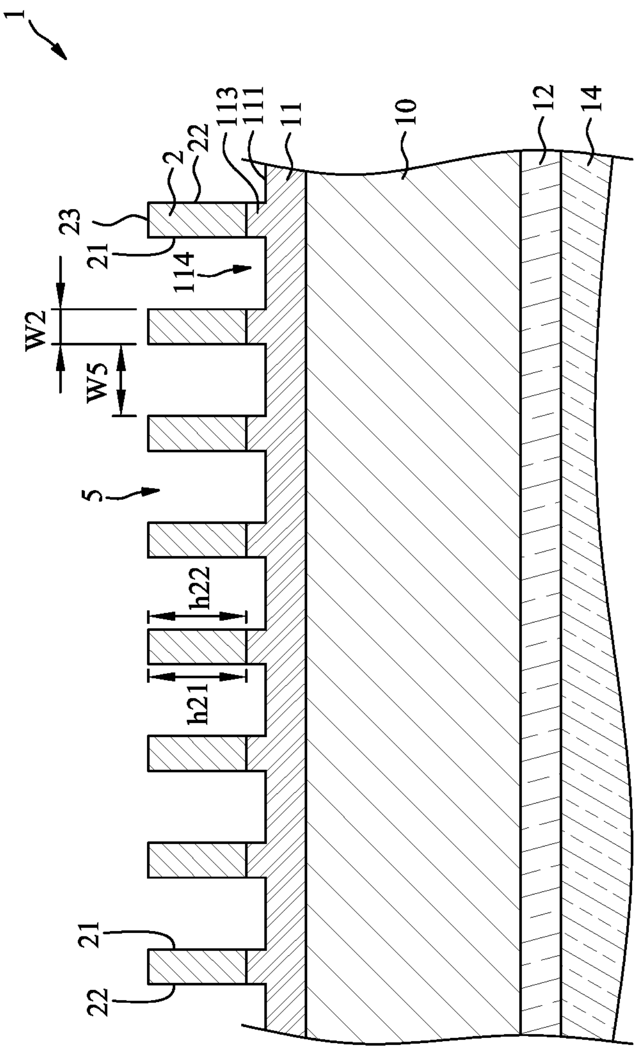
FIG. 1 illustrates a cross-sectional view of an assembly structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms “a,” “an” and “the” are intended to include the plural forms as well, unless the context clearly indicates otherwise. It shall be further understood that the terms “comprises” and “comprising,” when used in this specification, point out the presence of stated features, integers, steps, operations, elements, or components, but do not preclude the presence or addition of one or more other features, integers, steps, operations, elements, components, or groups thereof.

Figure 2:
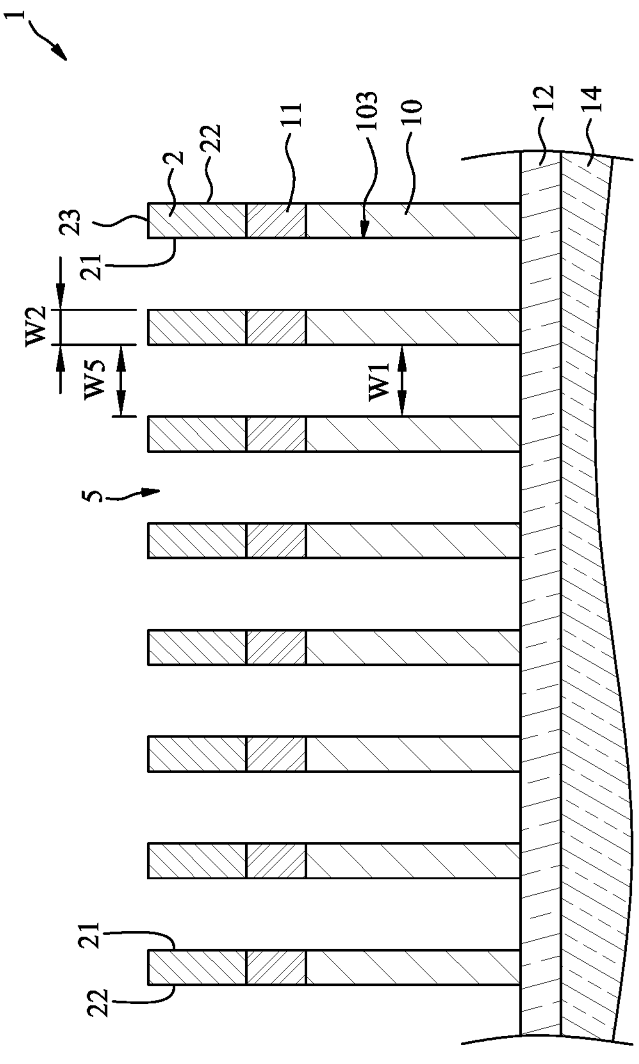
FIG. 2 illustrates a cross-sectional view of the assembly structure of FIG. 1, wherein the assembly structure includes a plurality of openings.
Figure 3:
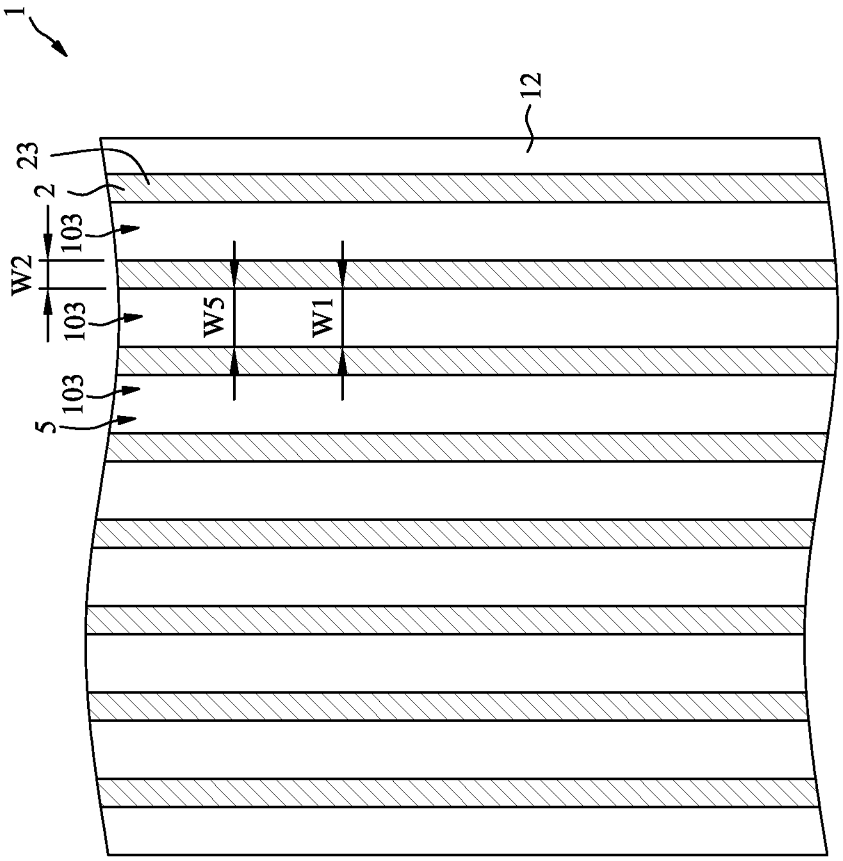
FIG. 3 illustrates a top view of the assembly structure of FIG. 2.

FIG. 1 illustrates a cross-sectional view of an assembly structure 1 in accordance with some embodiments of the present disclosure. FIG. 2 illustrates a cross-sectional view of the assembly structure 1 of FIG. 1, wherein the assembly structure 1 includes a plurality of openings 103. FIG. 3 illustrates a top view of the assembly structure 1 of FIG. 2.

In some embodiments, the assembly structure 1 may be used to form a plurality of openings or trenches in a semiconductor device that includes a circuit, such as a memory cell. In some embodiments, the memory cell may include a dynamic random access memory cell (DRAM cell).

The assembly structure 1 may include a main boy 14, an intermediate layer 12, a base material 10, a sacrificial layer 11 and a plurality of spacers 2. The main boy 14 may be a substrate, and may include a dielectric material, such as an oxide material or a nitride material. Alternatively, the main boy 14 may be a substrate, and may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

The intermediate layer 12 may be disposed on the main boy 14. In some embodiments, the intermediate layer 12 may be a conductive layer or a dielectric layer such as an oxide layer or a nitride layer. The base material 10 may be disposed on the intermediate layer 12. In some embodiments, the base material 10 may be, for example, a carbon layer.

In some embodiment, the main boy 14 and the intermediate layer 12 may be omitted, and the base material 10 may be a substrate, and may include a dielectric material, such as an oxide material or a nitride material. Alternatively, the base material 10 may be a substrate, and may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

The sacrificial layer 11 may be disposed on the base material 10. In some embodiments, the sacrificial layer 11 may be, for example, a dielectric anti-reflective coating (DARC) layer. However, in other embodiments, the intermediate layer 12 and the base material 10 may be also sacrificial layers and may be removed after a formation of a plurality of openings in the main boy 14. The sacrificial layer 11 may have a top surface 111 and include a plurality of protrusions 113 protruding from the top surface 111 of the sacrificial layer 11. The protrusions 113 and the top surface 111 of the sacrificial layer 11 may collectively define a plurality of recesses 114.

The spacers 2 may be spaced apart from each other. A material of the spacers 2 may include an oxide material such as silicon oxide or a nitride material such as silicon nitride. The spacers 2 may be disposed on the sacrificial layer 11. Thus, the spacers 2 may be disposed over the base material 10. The sacrificial layer 11 may be disposed between the base material 10 and the spacers 2. Each of the spacers 2 may be disposed on each of the protrusions 113. Each of the protrusions 113 may be substantially conformal with each of the spacers 2.

Each of the spacers 2 may have a first lateral surface 21 and a second lateral surface 22 opposite to the first lateral surface 21. The second lateral surface 22 may be substantially parallel with the first lateral surface 21. A ratio of a height h22 of the second lateral surface 22 to a height h21 of the first lateral surface 21 may be greater than 90%. The ratio of the height h22 of the second lateral surface 22 to the height h21 of the first lateral surface 21 may be greater than 97%. As shown in FIG. 1, the ratio of the height h22 of the second lateral surface 22 to the height h21 of the first lateral surface 21 may be substantially equal to 100%. Thus, the height h22 of the second lateral surface 22 may be substantially equal to the height h21 of the first lateral surface 21. Each of the spacers 2 may further have a top surface 23 connecting to the first lateral surface 21 and the second lateral surface 22. The top surface 23 may be a flat surface and may be perpendicular to the first lateral surface 21 and the second lateral surface 22. Each of the spacers 2 may be in a rectangular shape in a cross-sectional view.

Each of the spacers 2 may have a width W2. One of the spacers 2 may have a consistent width W2 along a vertical direction. A gap 5 may be formed between adjacent two of the spacers 2, and may have a width W5. Each of the gaps 5 may have a width W5. One of the gaps 5 may have a consistent width W5 along a vertical direction. The width W2 of the spacer 2 may be substantially equal to or different from the width W5 of the gap 5. As shown in FIG. 1, the width W2 of the spacer 2 may be less than the width W5 of the gap 5. The width W5 of the gap 5 may be substantially equal to a width of the recesses 114 of the sacrificial layer 11.

Referring to FIG. 2, an etching process (e.g., a dry etching process) may be performed. The spacers 2 may be configured to be a mask structure during the etching process (e.g., the dry etching process). Thus, portions of the sacrificial layer 11 and the base material 10 that are not covered by the spacers 2 may be removed. A plurality of openings 103 (or trenches or holes) may be formed in the base material 10. After the etching process (e.g., the dry etching process), the base material 10 may define a plurality of openings 103 (or trenches or holes) corresponding to the spacers 2, since the spacers 2 are configured to be a mask structure during the formation of the openings 103 (or trenches or holes). Each of the openings 103 may have a consistent width W1. One of the openings 103 may have a consistent width W1 along a vertical direction. That is, in a cross-sectional view, a first surface of a first side wall of the opening 103 may be substantially parallel with a second surface of a second side wall of the opening 103 opposite to the first side wall. Both of the first surface and the second surface are flat surfaces. There may be no bowing shape in the opening 103.

Referring to FIG. 3, one of the spacers 2 may have a consistent width W2 along a horizontal direction, one of the gaps 5 may have a consistent width W5 along a horizontal direction. Thus, one of the openings 103 may have a consistent width W1 along a horizontal direction. Thus, a line width roughness (LWR) issue and a line edge roughness (LER) issue may be improved. For example, the width W2 of the spacer 2 may be less than 30 nm. The width W5 the gap 5 may be less than 30 nm. The width W1 of the opening 103 may be less than 30 nm. In some embodiments, if the assembly structure 1 is used to form a plurality conductive lines, the line width roughness (LWR) issue and the line edge roughness (LER) issue of the conductive lines may be improved.

In some embodiments, the spacers 2 and the sacrificial layer 11 may be removed after the etching process (e.g., the dry etching process). In some embodiments, the openings 103 may extend through the base material 10 and the intermediate layer 12, and may extend into the main boy 14. The spacers 2, the sacrificial layer 11 and the base material 10 may be removed after the etching process (e.g., the dry etching process).

Figure 4:
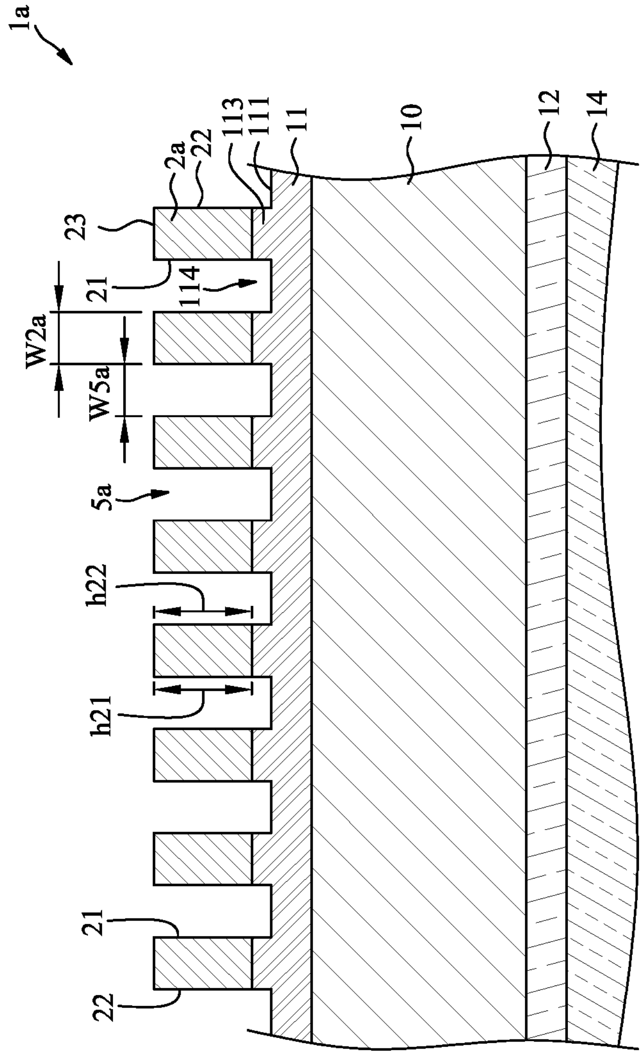
FIG. 4 illustrates a cross-sectional view of an assembly structure in accordance with some embodiments of the present disclosure.
Figure 5:
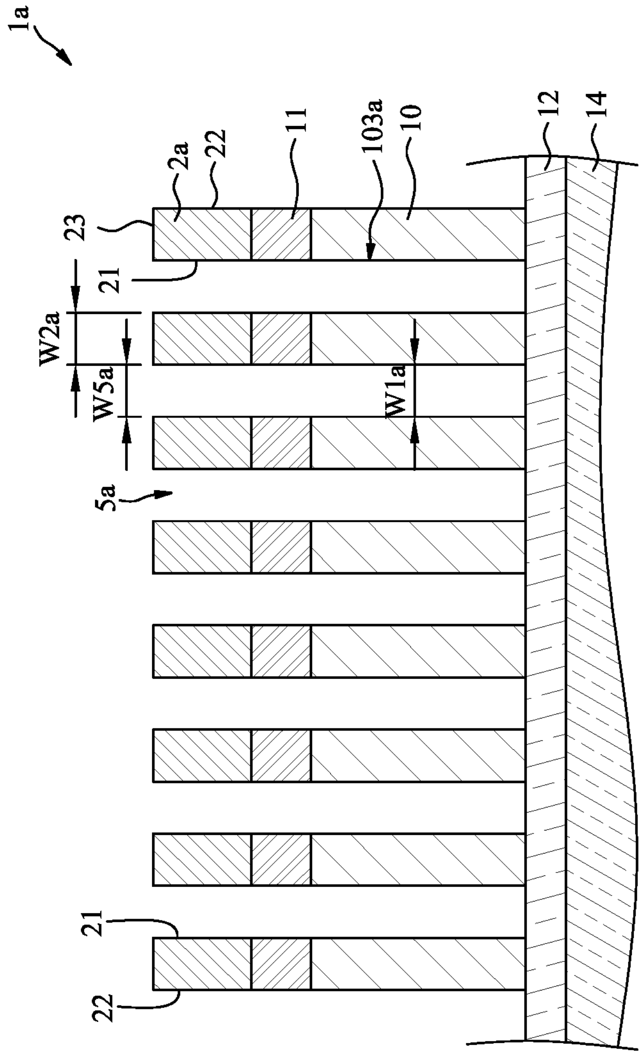
FIG. 5 illustrates a cross-sectional view of the assembly structure of FIG. 4, wherein the assembly structure includes a plurality of openings.
Figure 6:
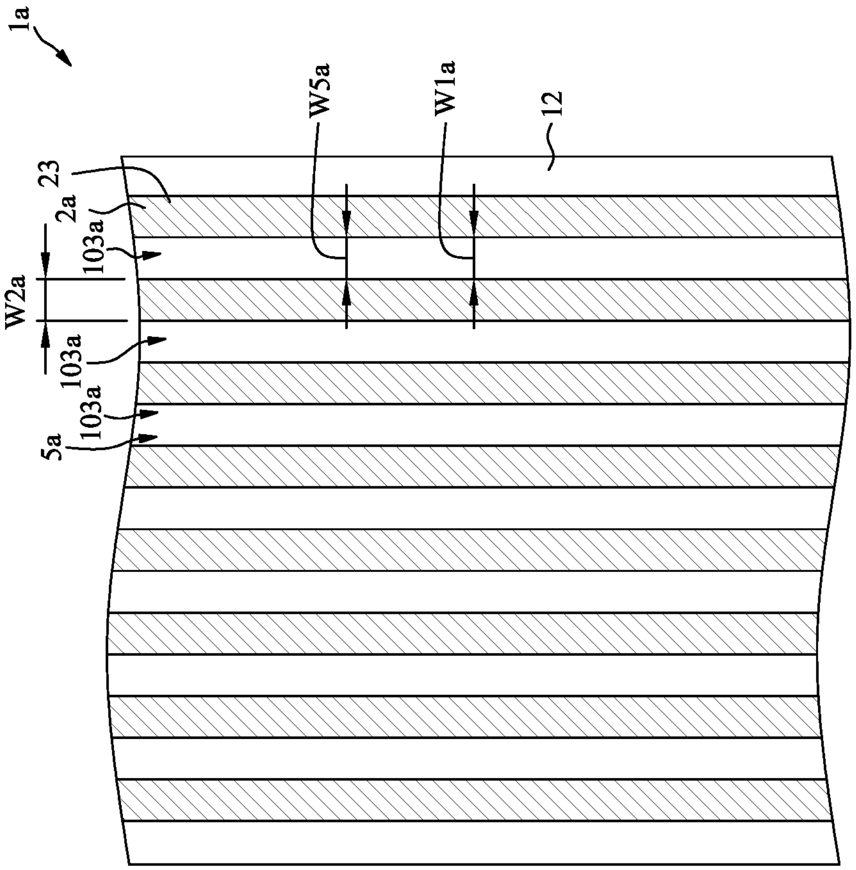
FIG. 6 illustrates a top view of the assembly structure of FIG. 5.

FIG. 4 illustrates a cross-sectional view of an assembly structure 1*a* in accordance with some embodiments of the present disclosure. FIG. 5 illustrates a cross-sectional view of the assembly structure 1*a* of FIG. 4, wherein the assembly structure 1*a* includes a plurality of openings 103*a*. FIG. 6 illustrates a top view of the assembly structure 1*a* of FIG. 5.

The assembly structure 1*a* may include a main boy 14, an intermediate layer 12, a base material 10, a sacrificial layer 11 and a plurality of spacers 2*a*. The main boy 14, the intermediate layer 12, the base material 10, the sacrificial layer 11 and the spacers 2*a* of FIG. 4 and FIG. 5 may be similar to the main boy 14, the intermediate layer 12, the base material 10, the sacrificial layer 11 and the spacers 2 of FIG. 1 and FIG. 2. The differences are described as follows.

As shown in FIG. 4, the intermediate layer 12 may be disposed on the main boy 14. The base material 10 may be disposed on the intermediate layer 12. The sacrificial layer 11 may be disposed on the base material 10. The spacers 2*a* may be disposed on the sacrificial layer 11. Thus, the spacers 2*a* may be disposed over the base material 10. The sacrificial layer 11 may be disposed between the base material 10 and the spacers 2*a*. Each of the spacers 2*a* may be disposed on each of the protrusions 113. Each of the protrusions 113 may be substantially conformal with each of the spacers 2*a*.

Each of the spacers 2*a* may have a first lateral surface 21 and a second lateral surface 22 opposite to the first lateral surface 21. The second lateral surface 22 may be substantially parallel with the first lateral surface 21. A ratio of a height h22 of the second lateral surface 22 to a height h21 of the first lateral surface 21 may be greater than 90%. The ratio of the height h22 of the second lateral surface 22 to the height h21 of the first lateral surface 21 may be greater than 97%. As shown in FIG. 4, the ratio of the height h22 of the second lateral surface 22 to the height h21 of the first lateral surface 21 may be substantially equal to 100%. Thus, the height h22 of the second lateral surface 22 may be substantially equal to the height h21 of the first lateral surface 21. Each of the spacers 2*a* may further have a top surface 23 connecting to the first lateral surface 21 and the second lateral surface 22. The top surface 23 may be a flat surface and may be perpendicular to the first lateral surface 21 and the second lateral surface 22. Each of the spacers 2 may be in a rectangular shape in a cross-sectional view.

Each of the spacers 2*a* may have a width W2*a*. One of the spacers 2*a* may have a consistent width W2*a* along a vertical direction. A gap 5*a* may be formed between adjacent two of the spacers 2*a*, and may have a width W5*a*. Each of the gaps 5*a* may have a width W5*a*. One of the gaps 5*a* may have a consistent width W5*a* along a vertical direction. The width W2*a* of the spacer 2*a* may be substantially equal to the width W5*a* of the gap 5*a*.

Referring to FIG. 5, an etching process (e.g., a dry etching process) may be performed. The spacers 2*a* may be configured to be a mask structure during the etching process (e.g., the dry etching process). Thus, portions of the sacrificial layer 11 and the base material 10 that are not covered by the spacers 2*a* may be removed. A plurality of openings 103*a* (or trenches or holes) may be formed in the base material 10. After the etching process (e.g., the dry etching process), the base material 10 may define a plurality of openings 103*a* (or trenches or holes) corresponding to the spacers 2*a*, since the spacers 2*a* are configured to be a mask structure during the formation of the openings 103*a* (or trenches or holes). Each of the openings 103*a* may have a consistent width W1*a*. One of the openings 103*a* may have a consistent width W1*a* along a vertical direction. That is, in a cross-sectional view, a first surface of a first side wall of the opening 103*a* may be substantially parallel with a second surface of a second side wall of the opening 103*a* opposite to the first side wall. Both of the first surface and the second surface are flat surfaces. There may be no bowing shape in the opening 103*a*.

Referring to FIG. 6, one of the spacers 2*a* may have a consistent width W2*a* along a horizontal direction, one of the gaps 5*a* may have a consistent width W5*a* along a horizontal direction. Thus, one of the openings 103*a* may have a consistent width W1*a* along a horizontal direction. Thus, a line width roughness (LWR) issue and a line edge roughness (LER) issue may be improved. For example, the width W2*a* of the spacer 2*a* may be less than 30 nm. The width W5*a* the gap 5 may be less than 30 nm. The width W1*a* of the opening 103*a* may be less than 30 nm. In some embodiments, if the assembly structure 1*a* is used to form a plurality conductive lines, the line width roughness (LWR) issue and the line edge roughness (LER) issue of the conductive lines may be improved.

Figure 7:
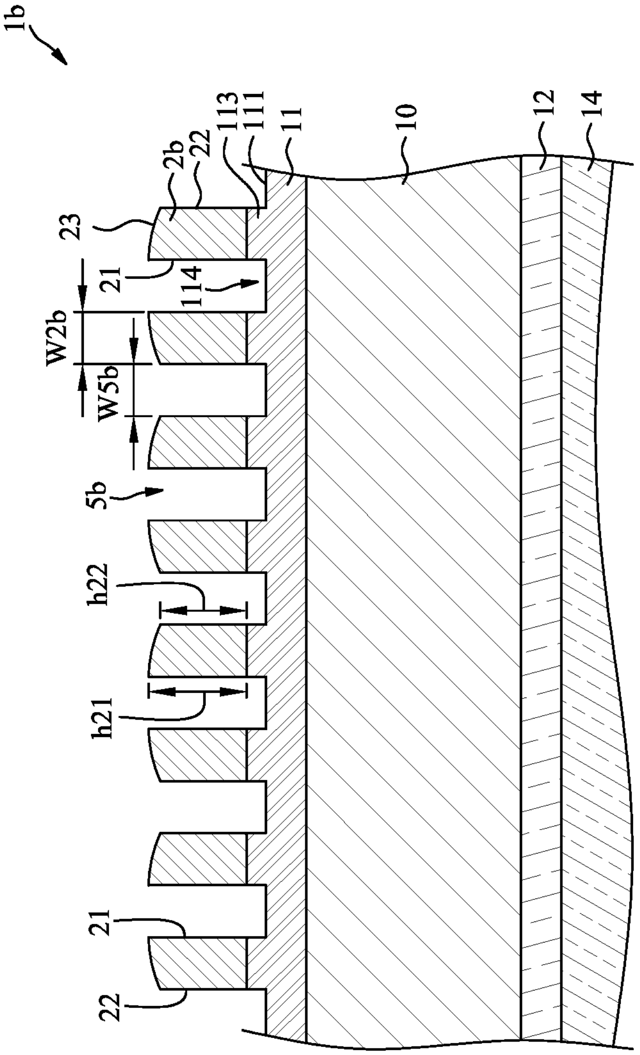
FIG. 7 illustrates a cross-sectional view of an assembly structure in accordance with some embodiments of the present disclosure.
Figure 8:
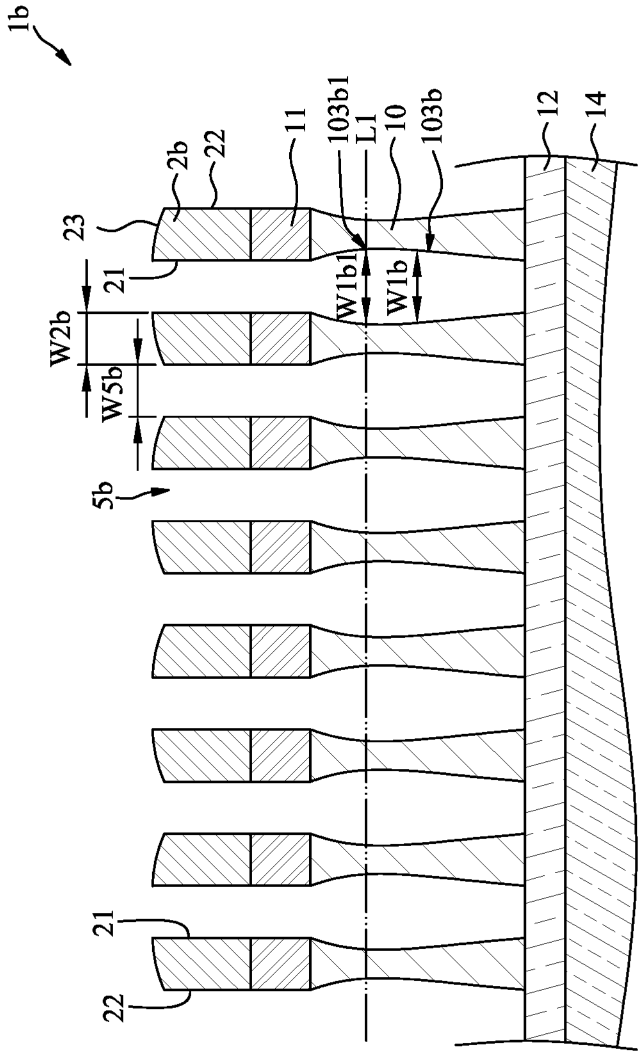
FIG. 8 illustrates a cross-sectional view of the assembly structure of FIG. 7, wherein the assembly structure includes a plurality of openings.

FIG. 7 illustrates a cross-sectional view of an assembly structure 1*b* in accordance with some embodiments of the present disclosure. FIG. 8 illustrates a cross-sectional view of the assembly structure 1*b* of FIG. 7, wherein the assembly structure 1*b* includes a plurality of openings 103*b*.

The assembly structure 1*b* may include a main boy 14, an intermediate layer 12, a base material 10, a sacrificial layer 11 and a plurality of spacers 2*b*. The main boy 14, the intermediate layer 12, the base material 10, the sacrificial layer 11 and the spacers 2*b* of FIG. 7 and FIG. 8 may be similar to the main boy 14, the intermediate layer 12, the base material 10, the sacrificial layer 11 and the spacers 2*a* of FIG. 4 and FIG. 5. The differences are described as follows.

As shown in FIG. 7, the intermediate layer 12 may be disposed on the main boy 14. The base material 10 may be disposed on the intermediate layer 12. The sacrificial layer 11 may be disposed on the base material 10. The spacers 2*b* may be disposed on the sacrificial layer 11. Thus, the spacers 2*b* may be disposed over the base material 10. The sacrificial layer 11 may be disposed between the base material 10 and the spacers 2*b*. Each of the spacers 2*b* may be disposed on each of the protrusions 113. Each of the protrusions 113 may be substantially conformal with each of the spacers 2*b*.

Each of the spacers 2*b* may have a first lateral surface 21 and a second lateral surface 22 opposite to the first lateral surface 21. The second lateral surface 22 may be substantially parallel with the first lateral surface 21. A ratio of a height h22 of the second lateral surface 22 to a height h21 of the first lateral surface 21 may be substantially equal to 90%. Thus, the height h22 of the second lateral surface 22 may be substantially equal to 0.9 times the height h21 of the first lateral surface 21. The height h22 of the second lateral surface 22 may be less than the height h21 of the first lateral surface 21. Each of the spacers 2*b* may further have a top surface 23 connecting to the first lateral surface 21 and the second lateral surface 22. The top surface 23 may include a curved surface and may be not perpendicular to the first lateral surface 21 and the second lateral surface 22.

Each of the spacers 2*b* may have a width W2*b*. One of the spacers 2*b* may have a non-consistent width W2*b* at its top end. A gap 5*b* may be formed between adjacent two of the spacers 2*b*, and may have a width W5*b*. Each of the gaps 5*b* may have a width W5*b*. One of the gaps 5*b* may have a consistent width W5*b* along a vertical direction. The width W2*b* of the spacer 2*b* may be substantially equal to the width W5*b* of the gap 5*b*.

Referring to FIG. 8, an etching process (e.g., a dry etching process) may be performed. The spacers 2*b* may be configured to be a mask structure during the etching process (e.g., the dry etching process). Thus, portions of the sacrificial layer 11 and the base material 10 that are not covered by the spacers 2*b* may be removed. A plurality of openings 103*b* (or trenches or holes) may be formed in the base material 10. After the etching process (e.g., the dry etching process), the base material 10 may define a plurality of openings 103*b* (or trenches or holes) corresponding to the spacers 2*b*, since the spacers 2*b* are configured to be a mask structure during the formation of the openings 103*b* (or trenches or holes). Each of the openings 103*b* may have a non-consistent width W1*b*.

Each of the openings 103*b* may include a first portion 103*b*1 having a maximum width W1*b*1. All of the first portions 103*b*1 of the openings 103*b* may be disposed at a same level L1 or a same elevation.

That is, in a cross-sectional view, a first surface of a first side wall of the opening 103*b* may be non-parallel with a second surface of a second side wall of the opening 103*b* opposite to the first side wall. Both of the first surface and the second surface are curved surfaces. There may be a bowing shape in the opening 103*b*.

In some embodiments, from a top view, one of the spacers 2*b* may have a consistent width W2*a* along a horizontal direction, one of the gaps 5*a* may have a consistent width W5*a* along a horizontal direction. Thus, a line width roughness (LWR) issue and a line edge roughness (LER) issue may be improved. In some embodiments, if the assembly structure 1*b* is used to form a plurality conductive lines, the line width roughness (LWR) issue and the line edge roughness (LER) issue of the conductive lines may be improved.

Figure 9:
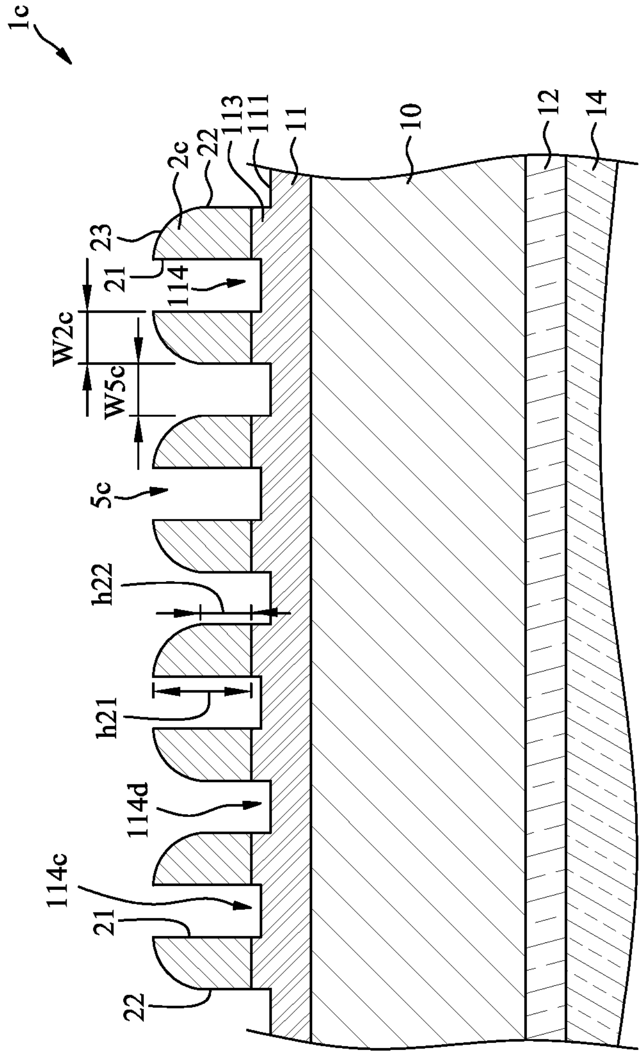
FIG. 9 illustrates a cross-sectional view of an assembly structure in accordance with a comparative embodiment of the present disclosure.
Figure 10:
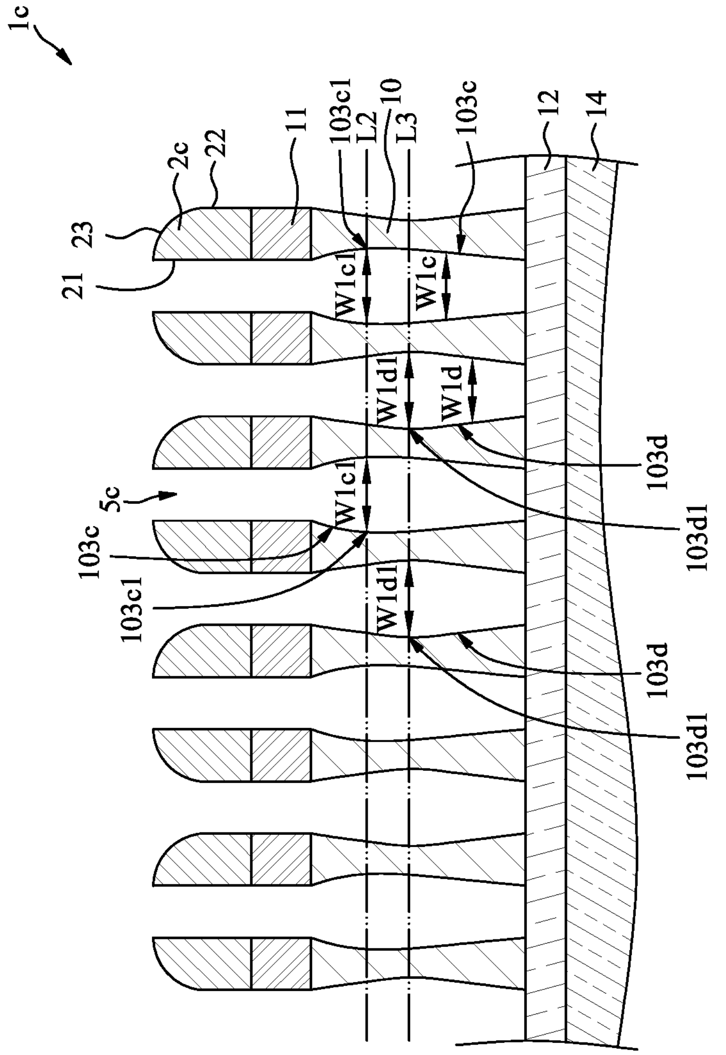
FIG. 10 illustrates a cross-sectional view of the assembly structure of FIG. 9, wherein the assembly structure includes a plurality of openings.

FIG. 9 illustrates a cross-sectional view of an assembly structure 1*c* in accordance with a comparative embodiment of the present disclosure. FIG. 10 illustrates a cross-sectional view of the assembly structure 1*c* of FIG. 9, wherein the assembly structure 1*c* includes a plurality of openings 103*c*, 103*d*.

The assembly structure 1*c* may include a main boy 14, an intermediate layer 12, a base material 10, a sacrificial layer 11 and a plurality of spacers 2*c*. The main boy 14, the intermediate layer 12, the base material 10, the sacrificial layer 11 and the spacers 2*c* of FIG. 9 and FIG. 10 may be similar to the main boy 14, the intermediate layer 12, the base material 10, the sacrificial layer 11 and the spacers 2*a* of FIG. 4 and FIG. 5. The differences are described as follows.

Each of the spacers 2*c* may have a first lateral surface 21 and a second lateral surface 22 opposite to the first lateral surface 21. The second lateral surface 22 may be substantially parallel with the first lateral surface 21. A ratio of a height h22 of the second lateral surface 22 to a height h21 of the first lateral surface 21 may be less than 90%. For example, the ratio of the height h22 of the second lateral surface 22 to the height h21 of the first lateral surface 21 may be equal to 60%. Thus, the height h22 of the second lateral surface 22 may be substantially equal to 0.6 times the height h21 of the first lateral surface 21. Each of the spacers 2*c* may further have a top surface 23 connecting to the first lateral surface 21 and the second lateral surface 22. The top surface 23 may include a curved surface and may be not perpendicular to the first lateral surface 21 and the second lateral surface 22. The profile of the curved top surface 23 may be referred to as "a shoulder" or "a circular sector".

Each of the spacers 2*c* may have a width W2*c*. One of the spacers 2*c* may have a non-consistent width W2*c* at its top end. A gap 5*c* may be formed between adjacent two of the spacers 2*c*, and may have a width W5*c*. Each of the gaps 5*c* may have a width W5*c*. One of the gaps 5*c* may have a consistent width W5*c* along a vertical direction. The width W2*c* of the spacer 2*c* may be substantially equal to the width W5*c* of the gap 5*c*.

In addition, the recesses 114 of the sacrificial layer 11 may have a non-consistent depth. For example, a depth of a first recess 114*c* may be less than a depth of a second recess 114*d*.

Referring to FIG. 10, an etching process (e.g., a dry etching process) may be performed. The spacers 2*c* may be configured to be a mask structure during the etching process (e.g., the dry etching process). Thus, portions of the sacrificial layer 11 and the base material 10 that are not covered by the spacers 2*c* may be removed. A plurality of openings (including a plurality of first openings 103*c* and a plurality of second openings 103*d*) may be formed in the base material 10. The shape of the first opening 103*c* may be different from the shape of the second opening 103*d*.

Each of the first openings 103*c* may have a non-consistent width W1*c*. Each of the first openings 103*c* may include a first portion 103*c*1 having a maximum width W1*c*1. All of the first portions 103*cl* of the first openings 103*c* may be disposed at a first level L2. There may be a bowing shape in the first opening 103*c*. In addition, each of the second openings 103*d* may have a non-consistent width W1*d*. Each of the second openings 103*d* may include a first portion 103*d*1 having a maximum width W1*d*1. All of the first portions 103*d*1 of the second openings 103*d* may be disposed at a second level L3. There may be a bowing shape in the second opening 103*d*. The second level L3 may be different from the first level L2. The second level L3 may be lower than the first level L2.

In some embodiments, from a top view, a line width roughness (LWR) issue and a line edge roughness (LER) issue of the assembly structure 1*c* may be serious. In some embodiments, if the assembly structure 1*c* is used to form a plurality conductive lines, the line width roughness (LWR) issue and the line edge roughness (LER) issue of the conductive lines may be serious.

Figure 11:
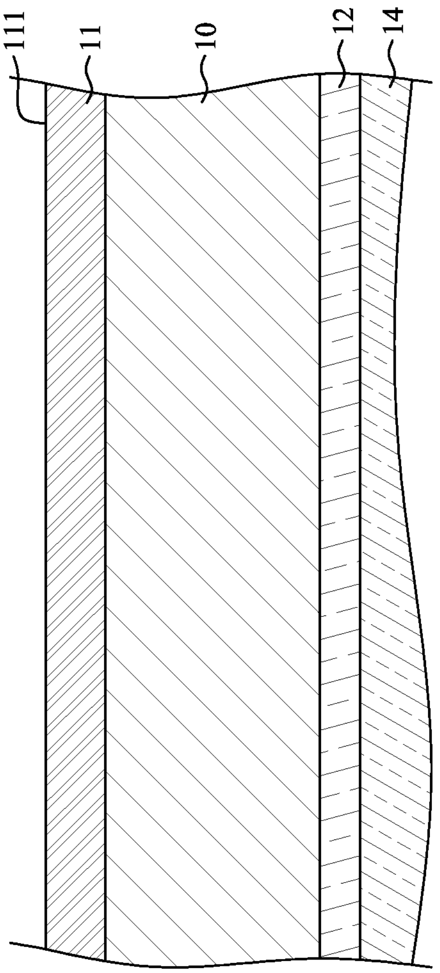
FIG. 11 through FIG. 20 illustrate a method of manufacturing a plurality of openings in a base material according to some embodiments of the present disclosure.

FIG. 11 through FIG. 20 illustrate a method of manufacturing a plurality of openings 103 in a base material 10 according to some embodiments of the present disclosure. FIG. 11 through FIG. 19 illustrate a method of manufacturing a plurality of spacers 2 on the base material 10 according to some embodiments of the present disclosure. Referring to FIG. 11, a base material 10 may be provided. The base material 10 of FIG. 11 may be same as or similar to the base material 10 of FIG. 1.

In some embodiments, the base material 10 may be, for example, a carbon layer. In some embodiment, the base material 10 may be a substrate, and may include a dielectric material, such as an oxide material or a nitride material. Alternatively, the base material 10 may be a substrate, and may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

In some embodiments, a main boy 14 and an intermediate layer 12 may be formed or disposed under the base material 10. A sacrificial layer 11 may be formed or disposed on the base material 10. The main boy 14, the intermediate layer 12 and the sacrificial layer 11 of FIG. 11 may be same as or similar to the main boy 14, the intermediate layer 12 and the sacrificial layer 11 of FIG. 1, respectively.

The main boy 14 may be a substrate, and may include a dielectric material, such as an oxide material or a nitride material. Alternatively, the main boy 14 may be a substrate, and may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

The intermediate layer 12 may be disposed between the base material 10 and the main boy 14. In some embodiments, the intermediate layer 12 may be a conductive layer or a dielectric layer such as an oxide layer or a nitride layer. In some embodiment, the main boy 14 and the intermediate layer 12 may be omitted. In some embodiments, the sacrificial layer 11 may be, for example, a dielectric anti-reflective coating (DARC) layer. However, in other embodiments, the intermediate layer 12 and the base material 10 may be also sacrificial layers and may be removed after a formation of a plurality of openings in the main boy 14. The sacrificial layer 11 may have a top surface 111.

Figure 12:
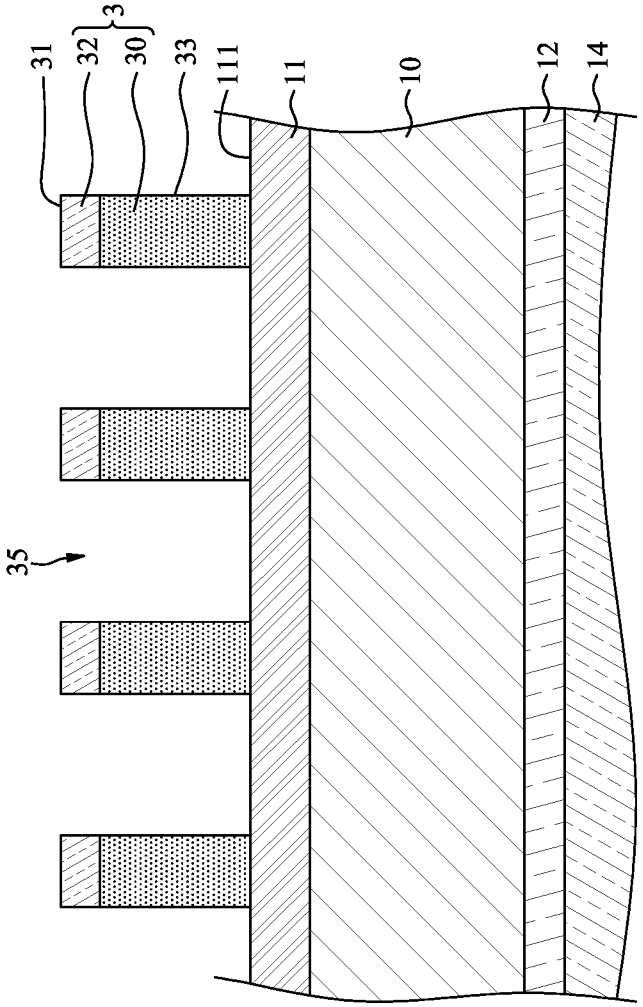

Referring to FIG. 12, a plurality of units 3 may be formed or disposed over the base material 10. In some embodiments, the units 3 may be formed or disposed on the top surface 111 of the sacrificial layer 11, and spaced apart from each other by a gap 35. Each of the units 3 may include an under layer (UL) 30 and a hard mask (HM) 32 on the under layer (UL) 30. The under layer (UL) 30 may include a photoresist material, and may be formed by coating. Alternatively, the under layer (UL) 30 may include a thermoplastic resin. The hard mask (HM) 32 may include a dielectric material (e.g., SiN and SiON), a metal material (e.g., Co and W), or an oxide material (e.g., $La_2O_3$, $ZrO_2$ and $Al_2O_3$). The hard mask (HM) 32 may be used to pattern the under layer (UL) 30. That is, the under layer (UL) 30 may be patterned by using the hard mask (HM) 32 as a mask layer. Thus, a width of the under layer (UL) 30 may be substantially equal to a width of the hard mask (HM) 32. Each of the units 3 may have a lateral surface 33 and a top surface 31.

Figure 13:
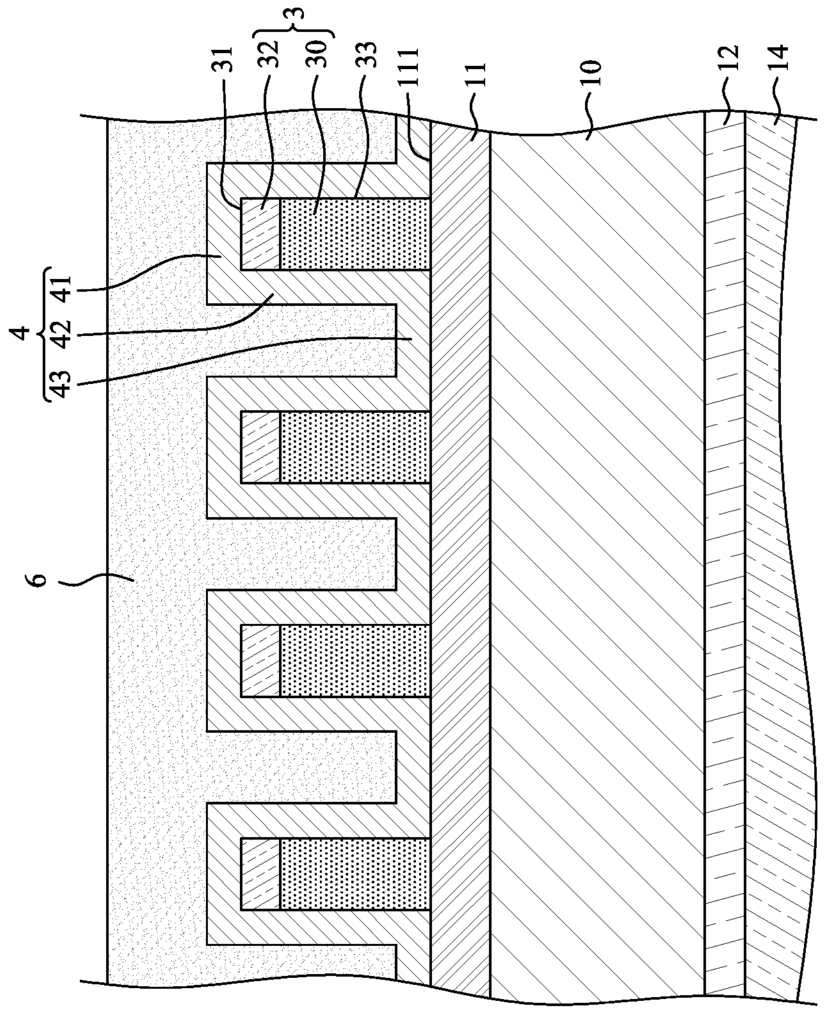

Referring to FIG. 13, a cover layer 4 may be formed to cover the units 3 and the top surface 111 of the sacrificial layer 11. The cover layer 4 may have a substantially consistent thickness. A material of the cover layer 4 may be same as the material of the spacer 2 of FIG. 1. The cover layer 4 may include a plurality of first portions 41, a plurality of second portions 42 and a plurality of third portions 43. The first portions 41 may be disposed on the top surfaces 31 of the units 3. The second portions 42 may be disposed on the lateral surfaces 33 of the units 3. The third portions 43 may be disposed on the top surface 111 of the sacrificial layer 11, and may connect the second portions 42. In some embodiments, a width of the under layer (UL) 30 may be greater than a thickness of the cover layer 4. A gap between the second portions 42 of the cover layer 4 on adjacent two units 3 may be substantially equal to the width of the under layer (UL) 30.

Then, an upper material 6 may be formed or disposed to cover the cover layer 4. The upper material 6 may extend into the gap 35 between the units 3. The upper material 6 may include a photoresist material, and may be formed by coating. Alternatively, the upper material 6 (UL) 30 may include a thermoplastic resin. A material of the upper material 6 may be same as or different the material of the under layer (UL) 30.

Figure 14:
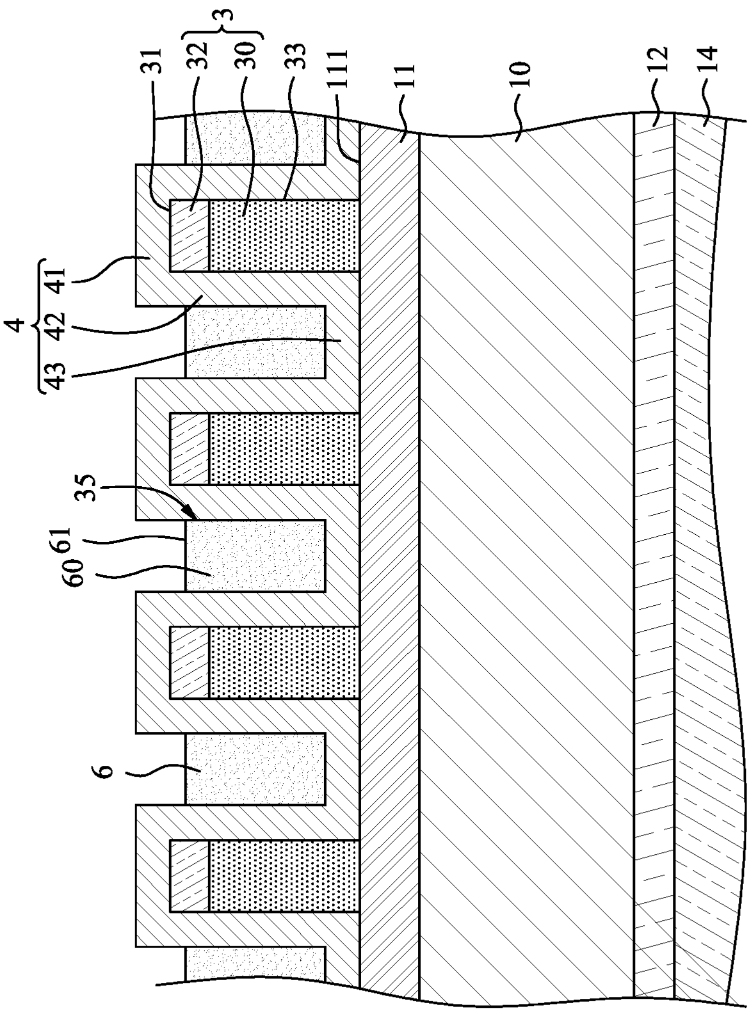

Referring to FIG. 14, a portion of the upper material 6 may be removed to remain a remaining portion 60 of the upper material 6 disposed in a gap 35 between the units 3 by, for example, a first etching process (e.g., dry etching). Meanwhile, the first portions 41 of the cover layer 4 are exposed from the remaining portion 60 of the upper material 6. The top surface 61 of the remaining portion 60 of the upper material 6 may be lower than the top surface 31 of the unit 3.

Figure 15:
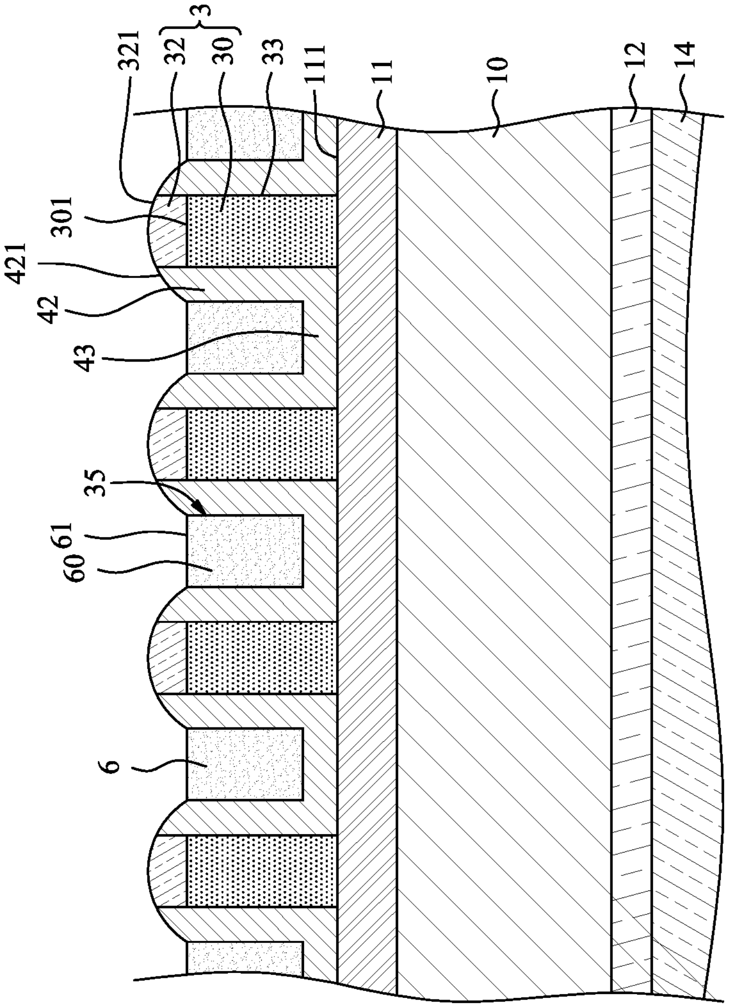

Referring to FIG. 15, the first portions 41 of the cover layer 4 and a portion of the hard mask (HM) 32 may be removed by, for example, a second etching process (e.g., dry etching). In some embodiments, the hard mask (HM) 32 may not be removed completely. A remaining portion of the hard mask (HM) 32 may remain. A top surface 421 of the second portion 42 of the cover layer 4 may be a curved surface. A top surface 321 of the remaining portion of the hard mask (HM) 32 may be a curved surface. Thus, the hard mask (HM) 32 may have a curved top surface 321. The top surface 421 of the second portion 42 of the cover layer 4 and the top surface of the remaining portion of the hard mask (HM) 32 may be continuous, that is, they may be portions of a same curved surface. As shown in FIG. 15, the under layer (UL) 30 may be not exposed to air. The top surface 61 of the remaining portion 60 of the upper material 6 may be substantially level with the top surface of the under layer (UL) 30.

Figure 16:
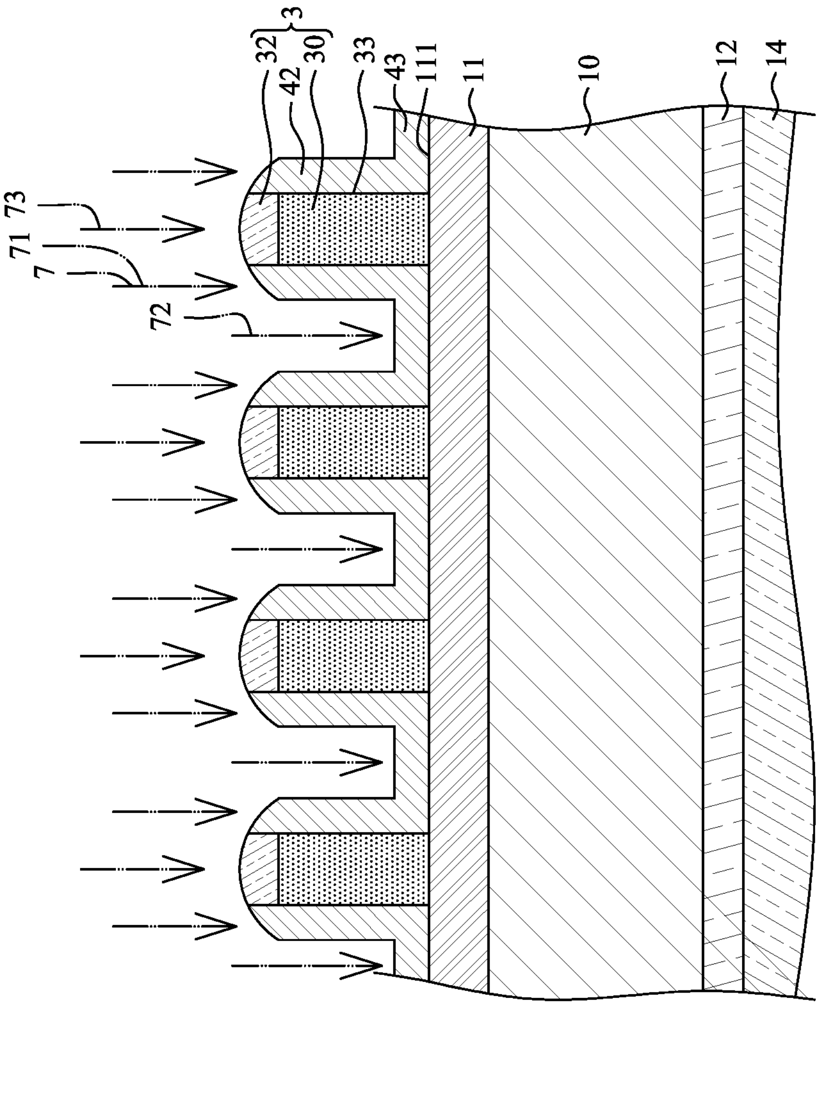

Referring to FIG. 16, the remaining portion 60 of the upper material 6 may be removed, by, for example, stripping. Thus, the upper material 6 and the first portions 41 of the cover layer 4 may be removed completely. Then, a third etching process (e.g., dry etching) may be performed. An etching gas 7 may be applied. The etching gas 7 may include fluorocarbons such as $C_4F_6$ and $C_4F_8$. The etching gas 7 may include a first portion 71, a second portion 72 and a third portion 73. The first portion 71 of the etching gas 7 may be used to remove an upper portion of the second portion 42 of the cover layer 4. The second portion 72 of the etching gas 7 may be used to remove the third portion 43 of the cover layer 4. The third portion 73 of the etching gas 7 may be used to remove the remaining portion of the hard mask (HM) 32. Thus, the hard mask (HM) 32 and the third portions 43 of the cover layer 4 may be removed completely by using the etching gas 7.

Figure 17:
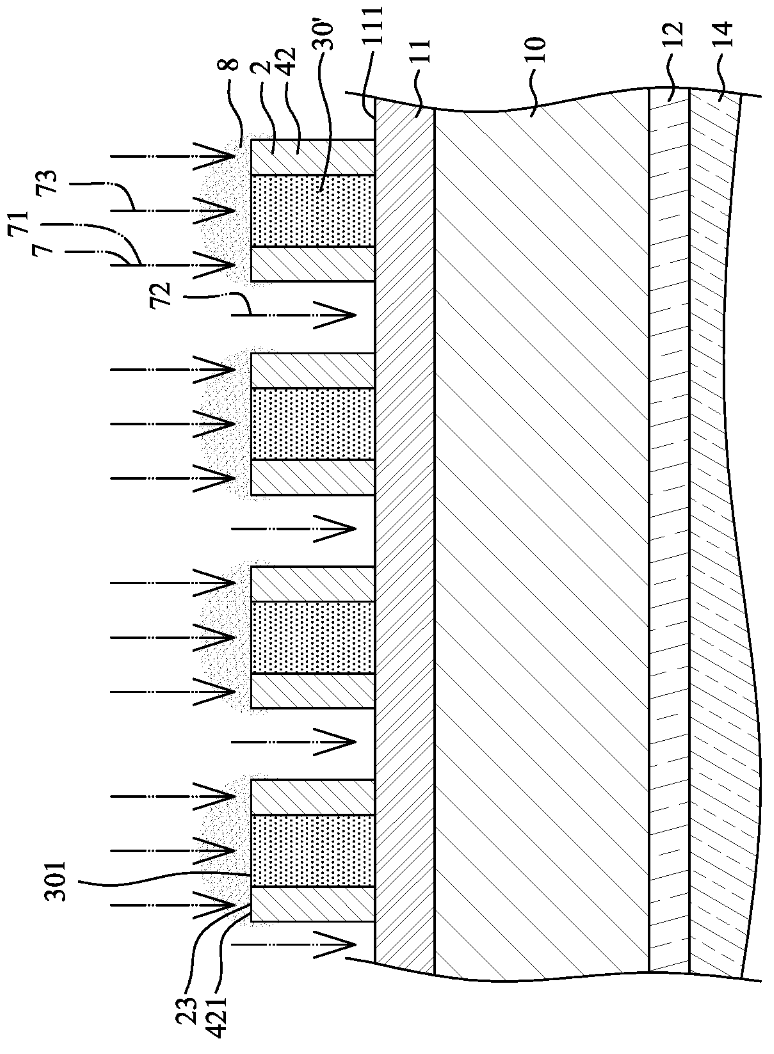

Referring to FIG. 17, the etching gas 7 may be applied continuously. That is, the third etching process continues. After the hard mask (HM) 32 is removed, the third portion 73 of the etching gas 7 may contact the under layer (UL) 30 to remove an upper portion of the under layer (UL) 30 to form a remaining portion 30' of the under layer (UL) 30. The first portion 71 of the etching gas 7 may continue to remove the upper portion of the second portion 42 of the cover layer 4 to form a plurality of spacers 2. That is, the remaining portion of the second portion 42 of the cover layer 4 become the spacers 2. During the third etching process, since the etching gas 7 has a high etch selectivity to the under layer (UL) 30, the third portion 73 of the etching gas 7 and the upper portion of the under layer (UL) 30 may react to form a polymer 8 to protect the spacers 2. That is, the bi-product (i.e., the polymer 8) of the under layer (UL) 30 during the third etching process may cover the top surface 23 of the spacers 2 (i.e., the top surface 421 of the second portion 42 of the cover layer 4) to prevent the first portion 71 of the etching gas 7 from further etching the spacers 2 (i.e., the remaining portion of the second portion 42 of the cover layer 4). Thus, the bi-product (i.e., the polymer 8) of the under layer (UL) 30 during the third etching process may protect the top profile of the spacer 2 (i.e., the top surface 421 of the second portion 42 of the cover layer 4).

Figure 18:
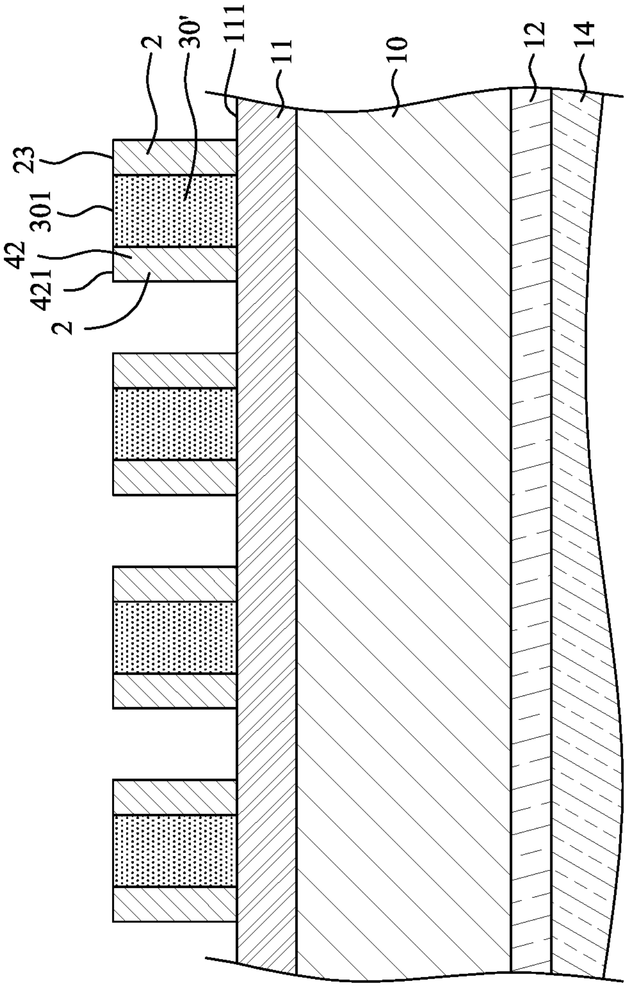

Referring to FIG. 18, in some embodiments, after the third etching process, the top surface 301 of the remaining portion 30' of the under layer (UL) 30 may be a flat surface. The top surface 23 of the spacer 2 (i.e., the top surface 421 of the second portion 42 of the cover layer 4) may be a flat surface. In some embodiments, the top surface 301 of the remaining portion 30' of the under layer (UL) 30 and the top surfaces 23 of the spacers 2 (i.e., the top surfaces 421 of the second portions 42 of the cover layer 4) may be substantially coplanar with each other. Therefore, a remaining portion 30' of the under layer (UL) 30 and two spacers 2 contacting the remaining portion 30' collectively form a rectangular shape in a cross-sectional view. There may be no "shoulder" or "circular sector" formed on the top surfaces 23 of the spacers 2 (i.e., the top surfaces 421 of the second portions 42 of the cover layer 4).

Figure 19:
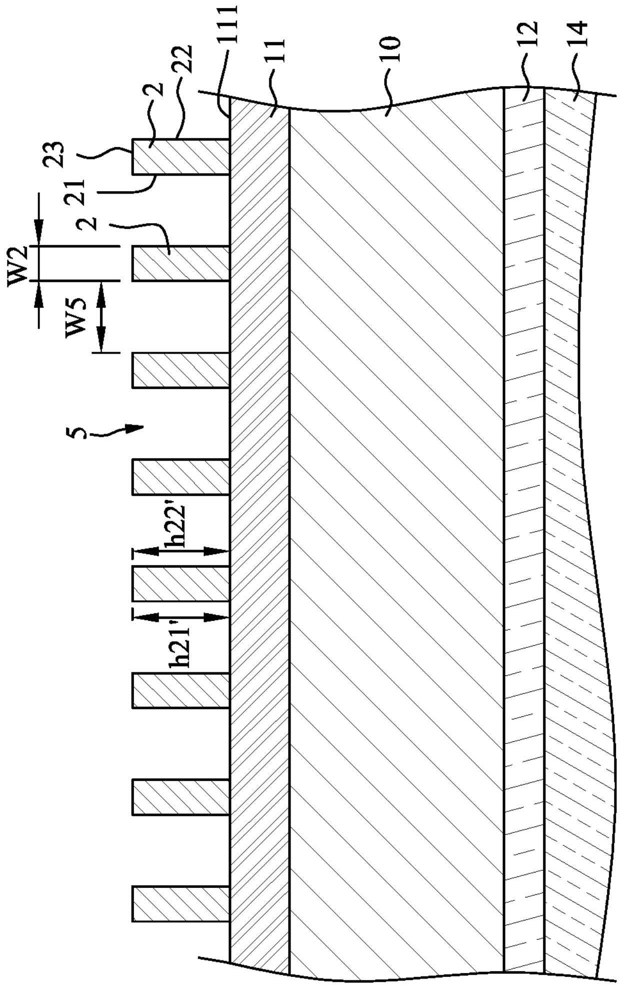

Referring to FIG. 19, the remaining portion 30' of the under layer (UL) 30 may be removed so as to form the separated spacers 2. The spacers 2 of FIG. 19 may be same as or similar to the spacers 2 of FIG. 1. In some embodiments, the remaining portion 30' of the under layer (UL) 30 may be removed by, for example, stripping the remaining portion 30' of the under layer (UL) 30 to remain the spacers 2 standing over the base material 10. The spacers 2 may be spaced apart from each other. The spacers 2 may be disposed on the sacrificial layer 11. Thus, the spacers 2 may be disposed over the base material 10. Each of the spacers 2 may have a first lateral surface 21 and a second lateral surface 22 opposite to the first lateral surface 21. The second lateral surface 22 may be substantially parallel with the first lateral surface 21. A ratio of a height h22' of the second lateral surface 22 to a height h21' of the first lateral surface 21 may be greater than 90%. The ratio of the height h22' of the second lateral surface 22 to the height h21' of the first lateral surface 21 may be greater than 97%. The ratio of the height h22' of the second lateral surface 22 to the height h21' of the first lateral surface 21 may be substantially equal to 100%. Thus, the height h22' of the second lateral surface 22 may be substantially equal to the height h21' of the first lateral surface 21. Each of the spacers 2 may further have a top surface 23 connecting to the first lateral surface 21 and the second lateral surface 22. The top surface 23 may be a flat surface and may be perpendicular to the first lateral surface 21 and the second lateral surface 22. Each of the spacers 2 may be in a rectangular shape in a cross-sectional view.

Each of the spacers 2 may have a width W2. One of the spacers 2 may have a consistent width W2 along a vertical direction. A gap 5 may be formed between adjacent two of the spacers 2, and may have a width W5. Each of the gaps 5 may have a width W5. One of the gaps 5 may have a consistent width W5 along a vertical direction. The width W2 of the spacer 2 may be substantially equal to or different from the width W5 of the gap 5. The width W2 of the spacer 2 may be less than the width W5 of the gap 5.

Referring to FIG. 1, a plurality of portions of the sacrificial layer 11 that are not covered by the spacers 2 may be removed by, for example, a fourth etching process (e.g., a dry etching process). That is, the fourth etching process may be conducted to the top surface 111 of the sacrificial layer 11. Thus, the sacrificial layer 11 may be thinned and may include a plurality of protrusions 113 protruding from the top surface 111 of the sacrificial layer 11. The protrusions 113 and the top surface 111 of the sacrificial layer 11 may collectively define a plurality of recesses 114.

Meanwhile, the first lateral surface 21 of the spacer 2 may have a height h21, and the second lateral surface 22 of the spacer 2 may have a height h22. The height h21 of the first lateral surface 21 of FIG. 1 may be equal to or less than the height h21' of the first lateral surface 21 of FIG. 19. The height h22 of the second lateral surface 22 of FIG. 1 may be equal to or less than the height h22' of the second lateral surface 22 of FIG. 19. As shown in FIG. 1, a ratio of the height h22 of the second lateral surface 22 to the height h21 of the first lateral surface 21 may be greater than 90%. The ratio of the height h22 of the second lateral surface 22 to the height h21 of the first lateral surface 21 may be greater than 97%. As shown in FIG. 1, the ratio of the height h22 of the second lateral surface 22 to the height h21 of the first lateral surface 21 may be substantially equal to 100%. Thus, the height h22 of the second lateral surface 22 may be substantially equal to the height h21 of the first lateral surface 21.

Referring to FIG. 2, a fifth etching process (e.g., a dry etching process) may be further performed. The spacers 2 may be configured to be a mask structure during the fifth etching process (e.g., the dry etching process). Thus, portions of the sacrificial layer 11 and the base material 10 that are not covered by the spacers 2 may be removed. A plurality of openings 103 (or trenches or holes) may be formed in the base material 10. After the fifth etching process (e.g., the dry etching process), the base material 10 may define a plurality of openings 103 (or trenches or holes) corresponding to the spacers 2, since the spacers 2 are configured to be a mask structure during the formation of the openings 103 (or trenches or holes). Thus, the openings 103 (or trenches or holes) are formed in the base material 10 by using the spacers 2 as mask structures. Each of the openings 103 may have a consistent width W1. One of the openings 103 may have a consistent width W1 along a vertical direction. That is, in a cross-sectional view, a first surface of a first side wall of the opening 103 may be substantially parallel with a second surface of a second side wall of the opening 103 opposite to the first side wall. Both of the first surface and the second surface are flat surfaces. There may be no bowing shape in the opening 103.

Figure 20:
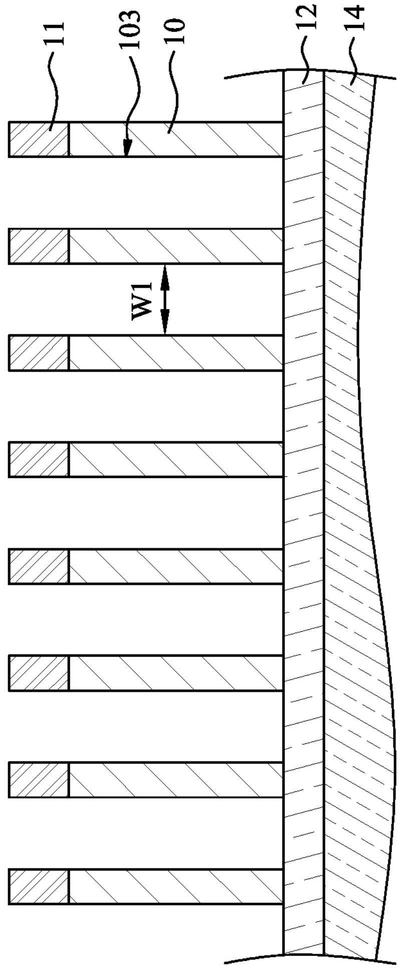

Referring to FIG. 20, the sacrificial layer 11 and the spacers 2 may be removed so as to form the openings 103 in the base material 10.

FIG. 21 through FIG. 26 illustrate a method of manufacturing a plurality of openings 103*a* in a base material 10 according to some embodiments of the present disclosure. FIG. 21 through FIG. 26 illustrate a method of manufacturing a plurality of spacers 2*a* on the base material 10 according to some embodiments of the present disclosure.

Figure 21:
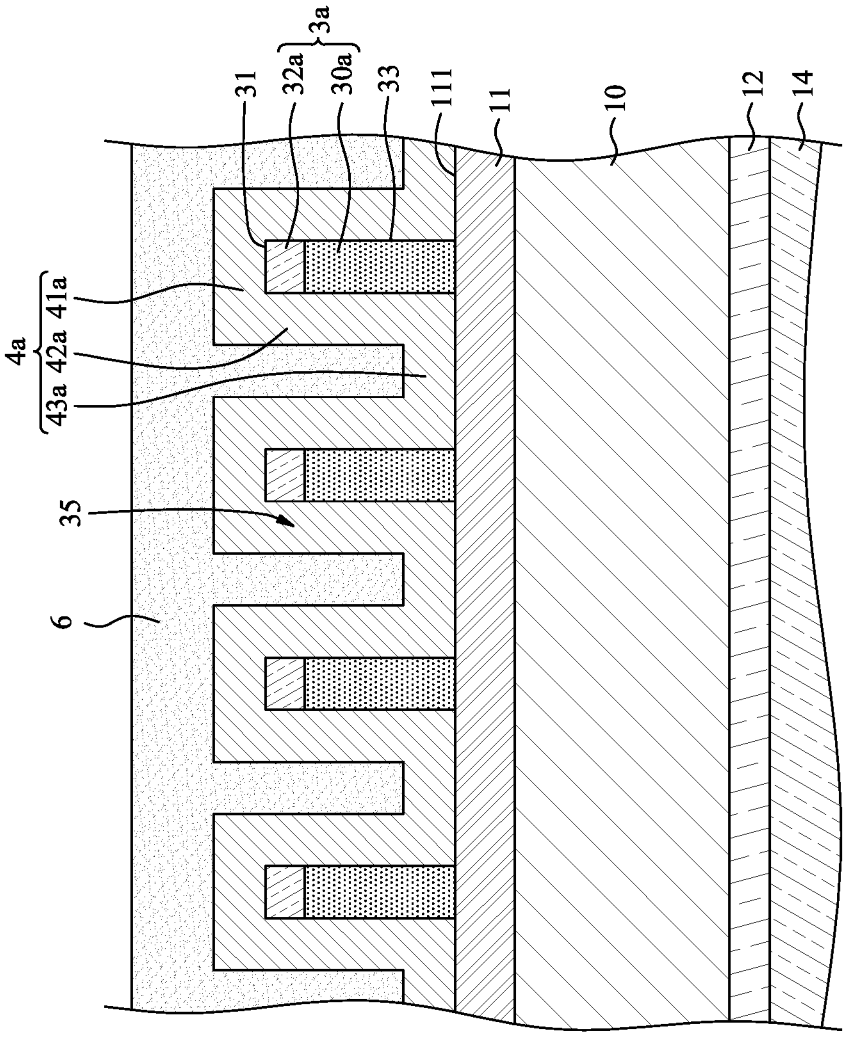
FIG. 21 through FIG. 26 illustrate a method of manufacturing a plurality of openings in a base material according to some embodiments of the present disclosure.

Referring to FIG. 21, a base material 10 may be provided. The base material 10 of FIG. 21 may be same as or similar to the base material 10 of FIG. 4. In some embodiments, a main boy 14 and an intermediate layer 12 may be formed or disposed under the base material 10. A sacrificial layer 11 may be formed or disposed on the base material 10. The main boy 14, the intermediate layer 12 and the sacrificial layer 11 of FIG. 21 may be same as or similar to the main boy 14, the intermediate layer 12 and the sacrificial layer 11 of FIG. 4, respectively.

Then, a plurality of units 3*a* may be formed or disposed over the base material 10. In some embodiments, the units 3 may be formed or disposed on the top surface 111 of the sacrificial layer 11, and spaced apart from each other by a gap 35. Each of the units 3*a* may include an under layer (UL) 30*a* and a hard mask (HM) 32*a* on the under layer (UL) 30*a*. Each of the units 3 may have a lateral surface 33 and a top surface 31.

Then, a cover layer 4*a* may be formed to cover the units 3*a* and the top surface 111 of the sacrificial layer 11. The cover layer 4*a* may include a plurality of first portions 41*a*, a plurality of second portions 42*a* and a plurality of third portions 43*a*. The first portions 41*a* may be disposed on the top surfaces 31 of the units 3*a*. The second portions 42*a* may be disposed on the lateral surfaces 33 of the units 3*a*. The third portions 43*a* may be disposed on the top surface 111 of the sacrificial layer 11, and may connect the second portions 42*a*.

In some embodiments, a width of the under layer (UL) 30*a* may be substantially equal a thickness of the cover layer 4*a*. A gap between the second portions 42*a* of the cover layer 4*a* on adjacent two units 3*a* may be substantially equal to the width of the under layer (UL) 30*a*.

Then, an upper material 6 may be formed or disposed to cover the cover layer 4. The upper material 6 may extend into the gap 35 between the units 3*a*. A material of the upper material 6 may be same as or different the material of the under layer (UL) 30*a*.

Figure 22:
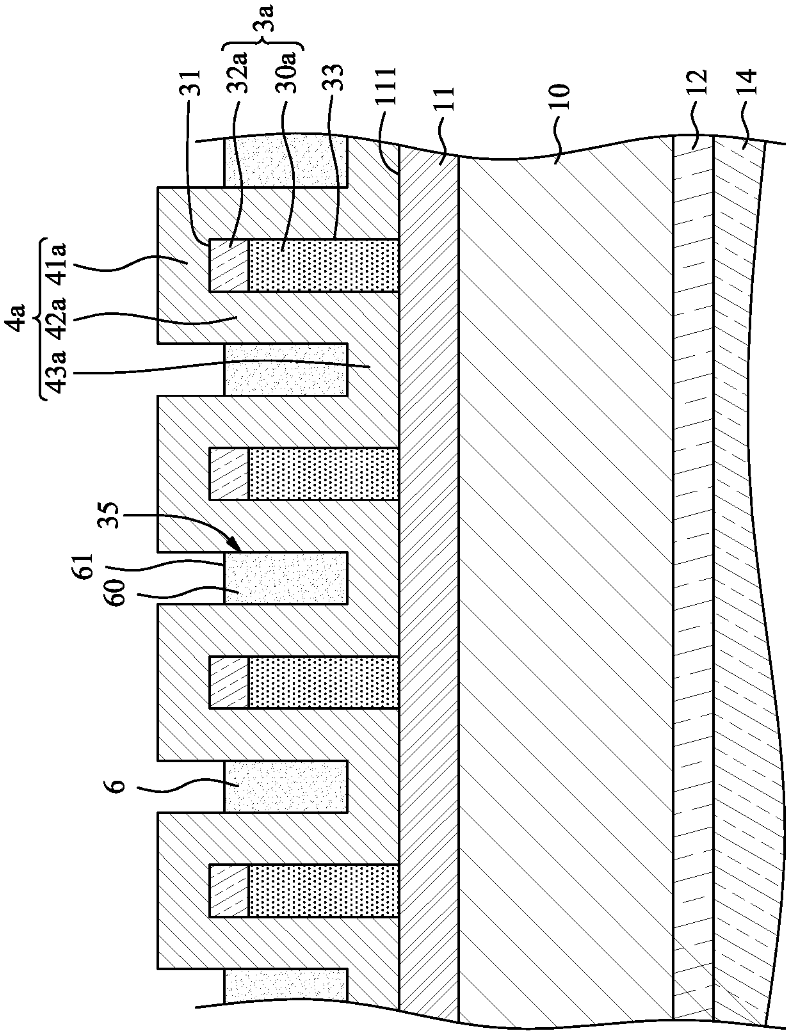

Referring to FIG. 22, a portion of the upper material 6 may be removed to remain a remaining portion 60 of the upper material 6 disposed in a gap 35 between the units 3*a* by, for example, a first etching process (e.g., dry etching). Meanwhile, the first portions 41*a* of the cover layer 4*a* are exposed from the remaining portion 60 of the upper material 6.

Figure 23:
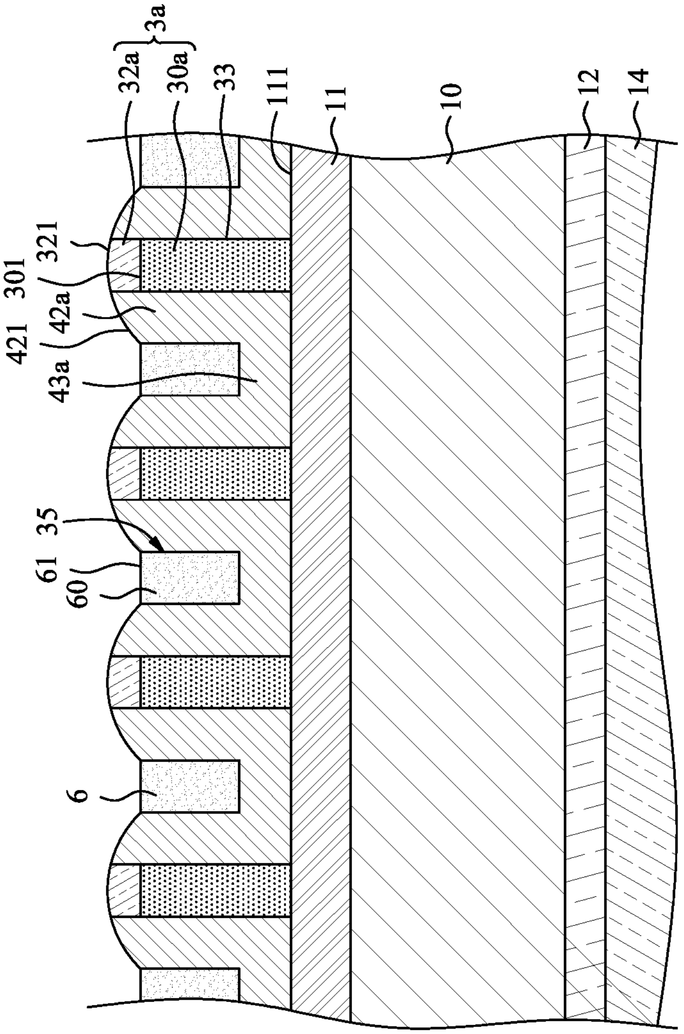

Referring to FIG. 23, the first portions 41*a* of the cover layer 4*a* and a portion of the hard mask (HM) 32*a* may be removed by, for example, a second etching process (e.g., dry etching). In some embodiments, the hard mask (HM) 32*a* may not be removed completely. A remaining portion of the hard mask (HM) 32*a* may remain. A top surface 421 of the second portion 42*a* of the cover layer 4*a* may be a curved surface. A top surface 321 of the remaining portion of the hard mask (HM) 32*a* may be a curved surface. Thus, the hard mask (HM) 32*a* may have a curved top surface 321. The top surface 421 of the second portion 42*a* of the cover layer 4*a* and the top surface of the remaining portion of the hard mask (HM) 32*a* may be continuous, that is, they may be portions of a same curved surface.

Figure 24:
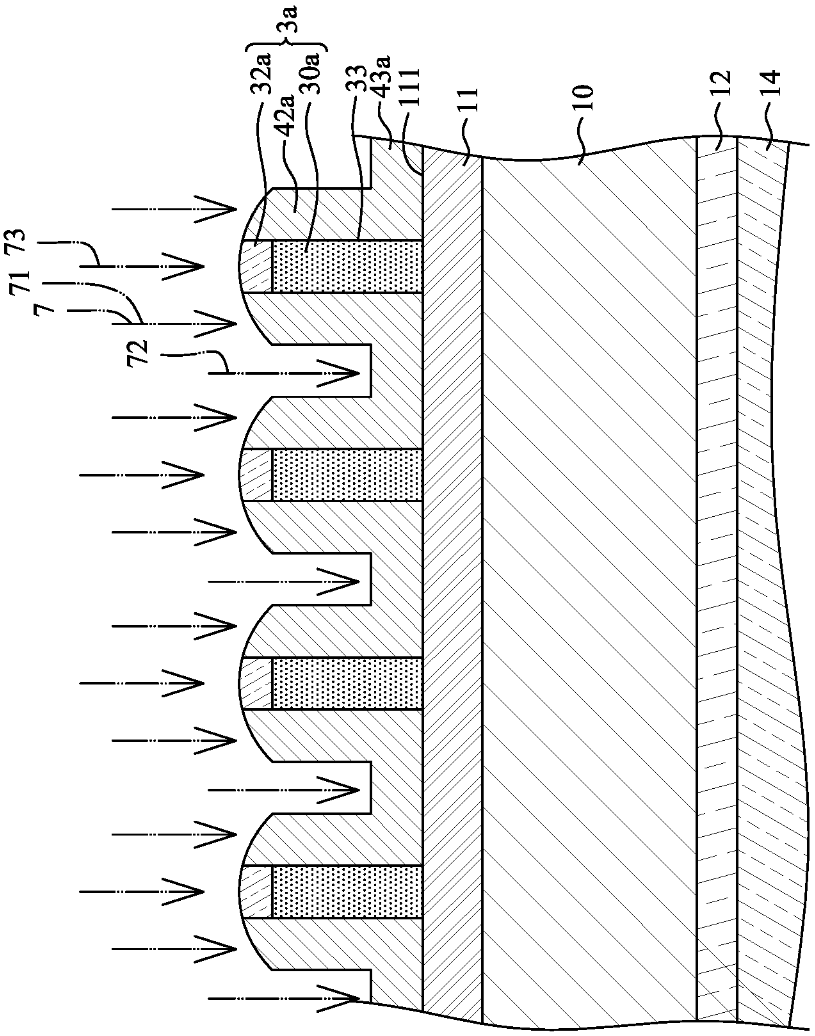

Referring to FIG. 24, the remaining portion 60 of the upper material 6 may be removed, by, for example, stripping. Thus, the upper material 6 and the first portions 41*a* of the cover layer 4*a* may be removed completely. Then, a third etching process (e.g., dry etching) may be performed. An etching gas 7 may be applied. The etching gas 7 may include fluorocarbons such as $C_4F_6$ and $C_4F_8$. The etching gas 7 may include a first portion 71, a second portion 72 and a third portion 73. The first portion 71 of the etching gas 7 may be used to remove an upper portion of the second portion 42*a* of the cover layer 4*a*. The second portion 72 of the etching gas 7 may be used to remove the third portion 43*a* of the cover layer 4*a*. The third portion 73 of the etching gas 7 may be used to remove the remaining portion of the hard mask (HM) 32*a*. Thus, the hard mask (HM) 32*a* and the third portions 43*a* of the cover layer 4*a* may be removed completely by using the etching gas 7.

Figure 25:
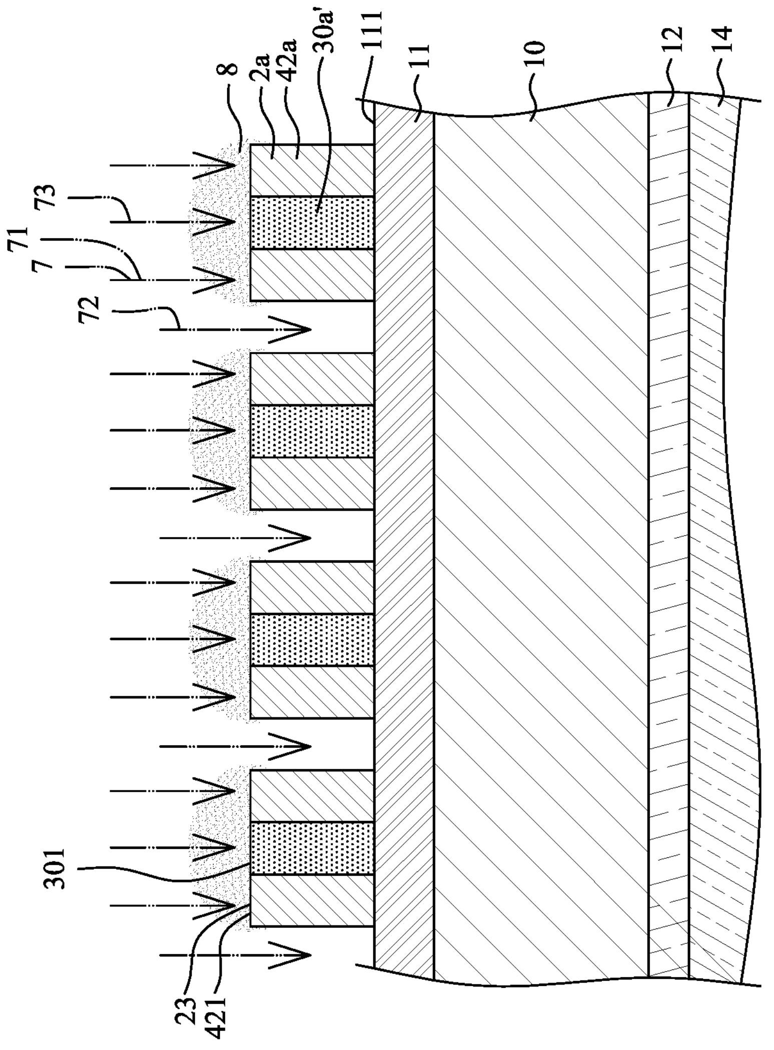

Referring to FIG. 25, the etching gas 7 may be applied continuously. That is, the third etching process continues. After the hard mask (HM) 32*a* is removed, the third portion 73 of the etching gas 7 may contact the under layer (UL) 30*a* to remove an upper portion of the under layer (UL) 30*a* to form a remaining portion 30*a*' of the under layer (UL) 30*a*. The first portion 71 of the etching gas 7 may continue to remove the upper portion of the second portion 42*a* of the cover layer 4*a* to form a plurality of spacers 2*a*. That is, the remaining portion of the second portion 42*a* of the cover layer 4*a* become the spacers 2*a*. During the third etching process, since the etching gas 7 has a high etch selectivity to the under layer (UL) 30*a*, the third portion 73 of the etching gas 7 and the upper portion of the under layer (UL) 30 may react to form a polymer 8 to protect the spacers 2*a*. That is, the bi-product (i.e., the polymer 8) of the under layer (UL) 30*a* during the third etching process may cover the top surface 23 of the spacers 2*a* (i.e., the top surface 421 of the second portion 42*a* of the cover layer 4*a*) to prevent the first portion 71 of the etching gas 7 from further etching the spacers 2*a*. Thus, the bi-product (i.e., the polymer 8) of the under layer (UL) 30*a* during the third etching process may protect the top profile of the spacer 2*a*.

Figure 26:
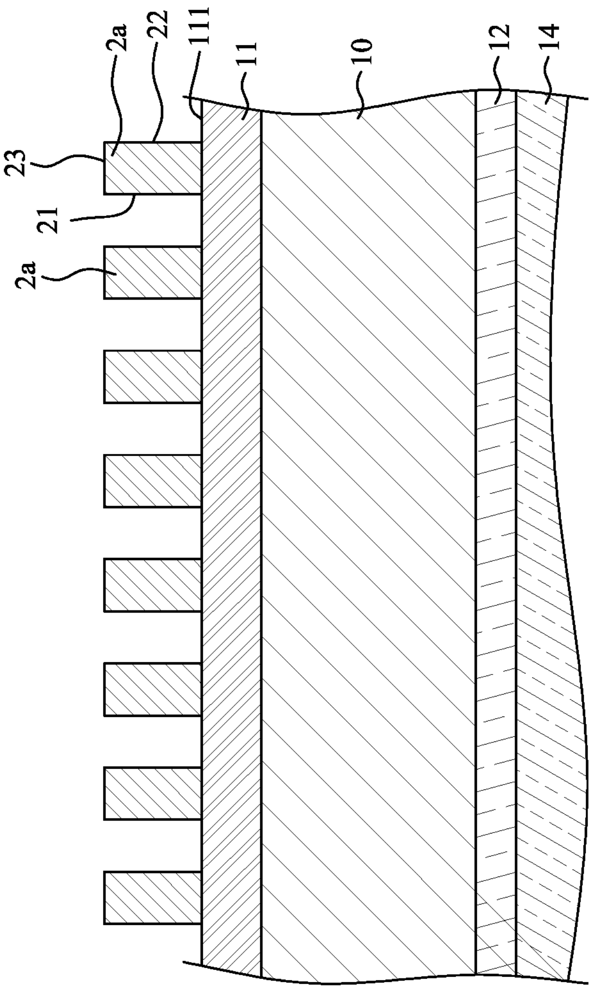

Referring to FIG. 26, the remaining portion 30*a*' of the under layer (UL) 30*a* may be removed so as to form the separated spacers 2*a*. The spacers 2*a* of FIG. 26 may be same as or similar to the spacers 2*a* of FIG. 4. Each of the spacers 2*a* may have a first lateral surface 21 and a second lateral surface 22 opposite to the first lateral surface 21. The second lateral surface 22 may be substantially parallel with the first lateral surface 21. Each of the spacers 2*a* may further have a top surface 23 connecting to the first lateral surface 21 and the second lateral surface 22. The top surface 23 may be a flat surface and may be perpendicular to the first lateral surface 21 and the second lateral surface 22. Each of the spacers 2*a* may be in a rectangular shape in a cross-sectional view.

Referring to FIG. 4, a plurality of portions of the sacrificial layer 11 that are not covered by the spacers 2*a* may be removed by, for example, a fourth etching process (e.g., a dry etching process). Thus, the sacrificial layer 11 may be thinned and may include a plurality of protrusions 113 protruding from the top surface 111 of the sacrificial layer 11. The protrusions 113 and the top surface 111 of the sacrificial layer 11 may collectively define a plurality of recesses 114.

Referring to FIG. 5, a fifth etching process (e.g., a dry etching process) may be further performed. The spacers 2*a* may be configured to be a mask structure during the fifth etching process (e.g., the dry etching process). Thus, portions of the sacrificial layer 11 and the base material 10 that are not covered by the spacers 2*a* may be removed. A plurality of openings 103*a* (or trenches or holes) may be formed in the base material 10. After the fifth etching process (e.g., the dry etching process), the base material 10 may define a plurality of openings 103*a* (or trenches or holes) corresponding to the spacers 2*a*, since the spacers 2*a* are configured to be a mask structure during the formation of the openings 103*a* (or trenches or holes). In some embodiments, the sacrificial layer 11 and the spacers 2*a* may be removed.

Figure 27:
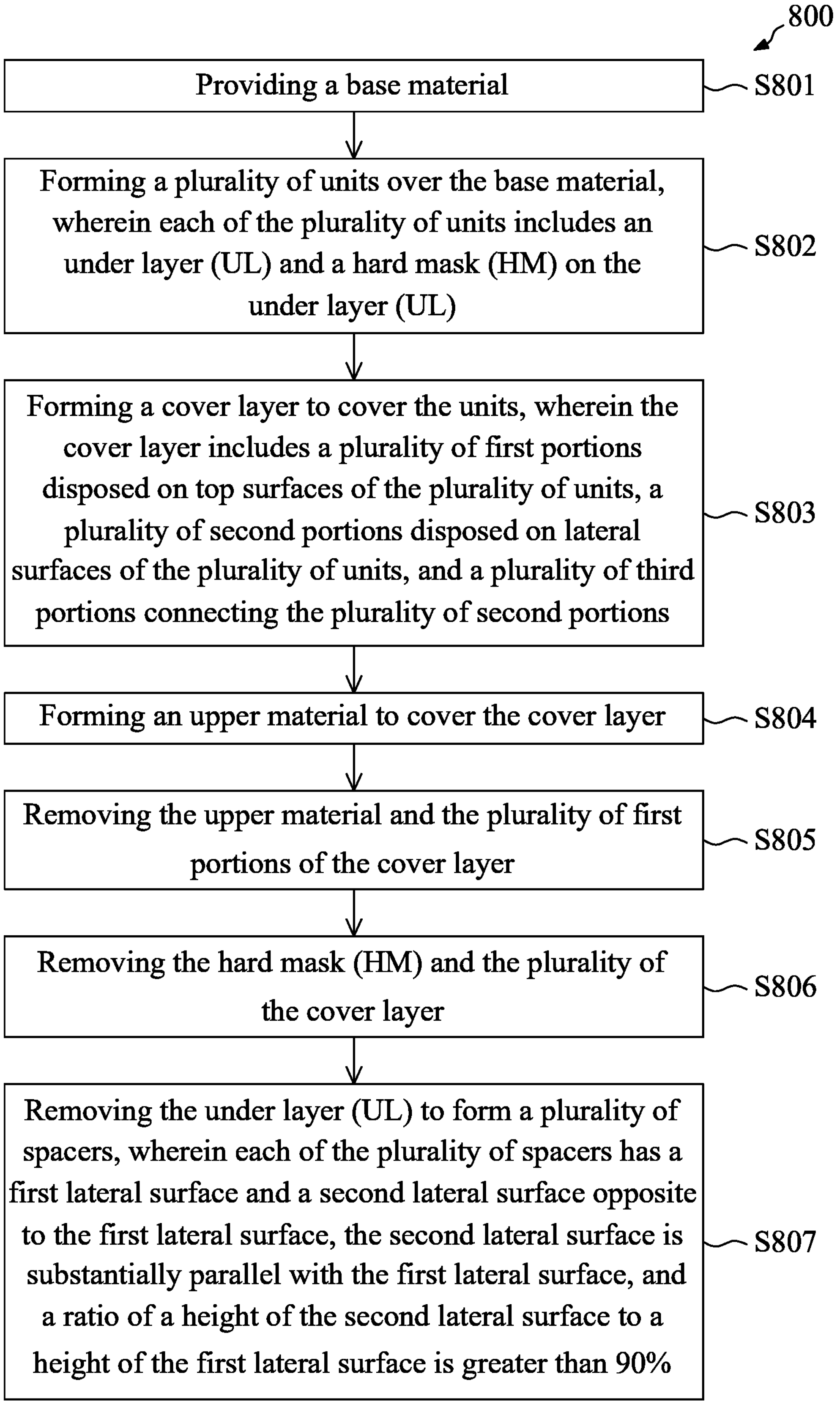
FIG. 27 illustrates a flow chart of a method of manufacturing a plurality of spacers according to some embodiments of the present disclosure.

FIG. 27 illustrates a flow chart of a method 800 of manufacturing a plurality of spacers according to some embodiments of the present disclosure.

In some embodiments, the method 800 can include a step S801, providing a base material. For example, as shown in FIG. 11, a base material 10 is provided.

In some embodiments, the method 800 can include a step S802, forming a plurality of units over the base material, wherein each of the plurality of units includes an under layer (UL) and a hard mask (HM) on the under layer (UL). For example, as shown in FIG. 12, a plurality of units 3 are formed over the base material 10. Each of the units 3 includes an under layer (UL) 30 and a hard mask (HM) 32 on the under layer (UL) 30.

In some embodiments, the method 800 can include a step S803, forming a cover layer to cover the units, wherein the cover layer includes a plurality of first portions disposed on top surfaces of the plurality of units, a plurality of second portions disposed on lateral surfaces of the plurality of units, and a plurality of third portions connecting the plurality of second portions. For example, as shown in FIG. 13, a cover layer 4 is formed to cover the units 3. The cover layer 4 includes a plurality of first portions 41 disposed on top surfaces 31 of the units 3, a plurality of second portions 42 disposed on lateral surfaces 33 of the units 3, and a plurality of third portions 43 connecting the second portions 42.

In some embodiments, the method 800 can include a step S804, forming an upper material to cover the cover layer. For example, as shown in FIG. 13, an upper material 6 is formed to cover the cover layer 4.

In some embodiments, the method 800 can include a step S805, removing the upper material and the plurality of first portions of the cover layer. For example, as shown in FIG. 16, the upper material 6 and the first portions 41 of the cover layer 4 are removed.

In some embodiments, the method 800 can include a step S806, removing the hard mask (HM) and the plurality of third portions of the cover layer. For example, as shown in FIG. 17, the hard mask (HM) 32 and the third portions 43 of the cover layer 4 are removed.

In some embodiments, the method 800 can include a step S807, removing the under layer (UL) to form a plurality of spacers, wherein each of the plurality of spacers has a first lateral surface and a second lateral surface opposite to the first lateral surface, the second lateral surface is substantially parallel with the first lateral surface, and a ratio of a height of the second lateral surface to a height of the first lateral surface is greater than 90%. For example, as shown in FIG. 19, the under layer (UL) 30' is removed to form a plurality of spacers 2. Each of the spacers 2 has a first lateral surface 21 and a second lateral surface 22 opposite to the first lateral surface 21. The second lateral surface 22 is substantially parallel with the first lateral surface 21. A ratio of a height h22' of the second lateral surface 22 to a height h21' of the first lateral surface 21 is greater than 90%.

Figure 28:
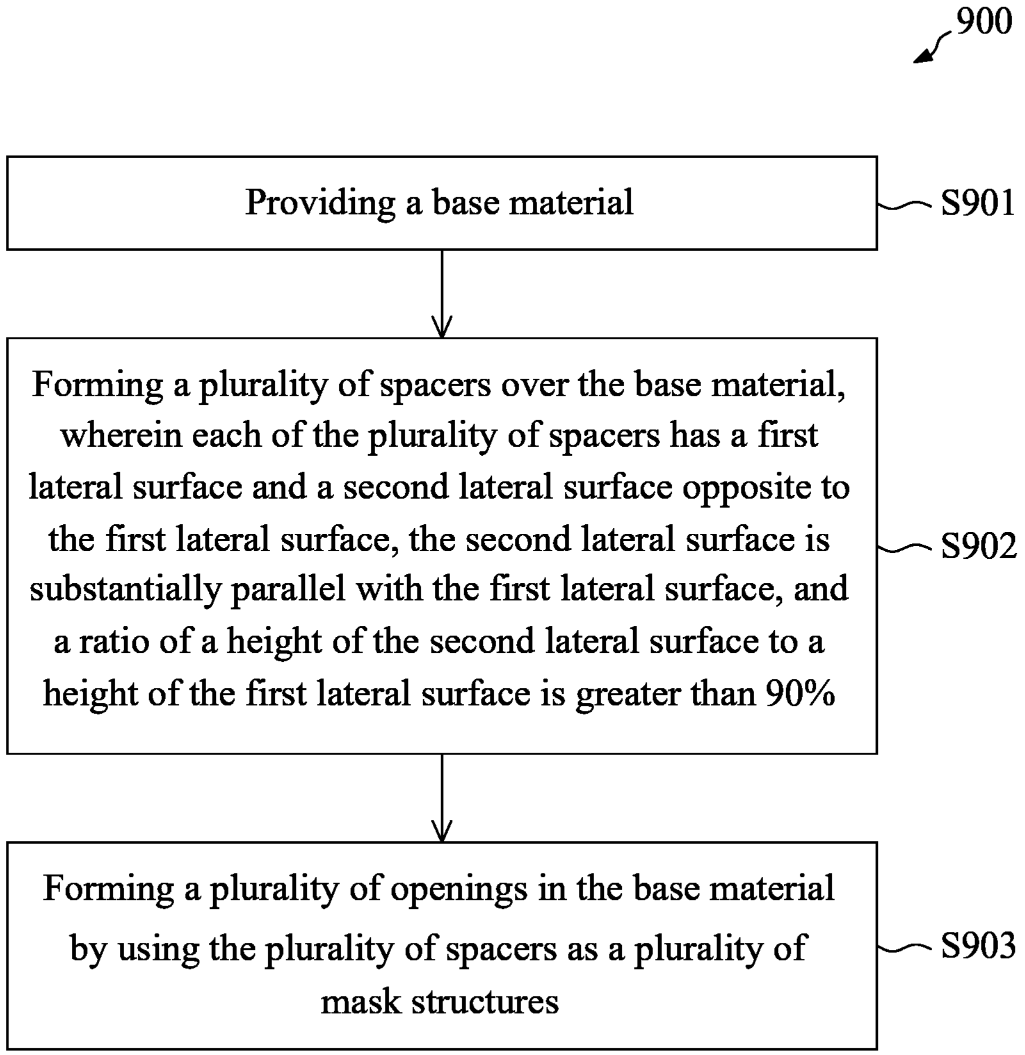
FIG. 28 illustrates a flow chart of a method of manufacturing a plurality of openings in a base material according to some embodiments of the present disclosure.

FIG. 28 illustrates a flow chart of a method 900 of manufacturing a plurality of openings in a base material according to some embodiments of the present disclosure.

In some embodiments, the method 900 can include a step S901, providing a base material. For example, as shown in FIG. 11, a base material 10 is provided.

In some embodiments, the method 900 can include a step S902, form a plurality of spacers over the base material, wherein each of the plurality of spacers has a first lateral surface and a second lateral surface opposite to the first lateral surface, the second lateral surface is substantially parallel with the first lateral surface, and a ratio of a height of the second lateral surface to a height of the first lateral surface is greater than 90%. For example, as shown in FIG. 19, a plurality of spacers 2 are formed over the base material 10. Each of the spacers 2 has a first lateral surface 21 and a second lateral surface 22 opposite to the first lateral surface 21. The second lateral surface 22 is substantially parallel with the first lateral surface 21. A ratio of a height h22' of the second lateral surface 22 to a height h21' of the first lateral surface 21 is greater than 90%.

In some embodiments, the method 900 can include a step S903, forming a plurality of openings in a base material by using the plurality of spacers as a plurality of mask structures. For example, as shown in FIG. 2, the openings 103 are formed in the base material 10 by using the spacers 2 as a plurality of mask structures.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a plurality of spacers, comprising:

providing a base material;

forming a plurality of units over the base material, wherein each of the plurality of units includes an under layer (UL) and a hard mask (HM) on the under layer (UL);

forming a cover layer to cover the units, wherein the cover layer includes a plurality of first portions disposed on top surfaces of the plurality of units, a plurality of second portions disposed on lateral surfaces of the plurality of units, and a plurality of third portions connecting the plurality of second portions;

forming an upper material to cover the cover layer;

removing the upper material and the plurality of first portions of the cover layer;

removing the hard mask (HM) and the plurality of third portions of the cover layer; and removing the under layer (UL) to form a plurality of spacers, wherein each of the plurality of spacers has a first lateral surface and a second lateral surface opposite to the first lateral surface, the second lateral surface is substantially parallel with the first lateral surface, and a ratio of a height of the second lateral surface to a height of the first lateral surface is greater than 90%;

wherein a sacrificial layer is disposed between the plurality of units and the base material, wherein after removing the under layer (UL) to form the plurality of spacers, the method further includes: removing a plurality of portions of the sacrificial layer that are not covered by the plurality of spacers;

wherein removing the hard mask (HM) and the plurality of third portions includes:

removing the hard mask (HM) and the plurality of third portions of the cover layer by using an etching gas; and removing an upper portion of the under layer (UL) and an upper portion of each of the plurality of second portions of the cover layer to form a remaining portion of the under layer (UL) and the plurality of spacers, wherein the etching gas and the upper portion of the under layer (UL) react to form a polymer to protect the plurality of spacers.

2. The method of claim 1, further comprising:

forming a sacrificial layer on the base material, wherein the plurality of units are formed on the sacrificial layer, and the plurality of third portions of the cover layer are disposed on the sacrificial layer.

3. The method of claim 1, wherein a material of the upper material is same as a material of the under layer (UL).

4. The method of claim 1, wherein removing the upper material and the plurality of first portions of the cover layer includes:

removing a portion of the upper material to remain a remaining portion of the upper material disposed in a gap between the units, wherein the plurality of first portions of the cover layer are exposed from the remaining portion of the upper material;

removing the plurality of first portions of the cover layer and a portion of the hard mask (HM).

5. The method of claim 4, wherein the hard mask (HM) has a curved top surface.

6. The method of claim 4, wherein a top surface of the remaining portion of the upper material is substantially level with a top surface of the under layer (UL).

7. The method of claim 4, further comprising:

removing the remaining portion of the upper material.

8. The method of claim 1, wherein removing the under layer (UL) to form the plurality of spacers includes:

stripping the under layer (UL) to remain the plurality of spacers standing over the base material.

9. The method of claim 1, wherein a top surface of the remaining portion of the under layer (UL) and top surfaces of the plurality of spacers are substantially coplanar with each other.

10. A method of manufacturing a plurality of openings in a base material, comprising:

providing a base material;

forming a plurality of spacers over the base material, wherein each of the plurality of pacers has a first lateral surface and a second lateral surface opposite to the first lateral surface, the second lateral surface is substantially parallel with the first lateral surface, and a ratio of a height of the second lateral surface to a height of the first lateral surface is greater than 90%; and forming a plurality of openings in the base material by using the plurality of spacers as a plurality of mask structures;

wherein forming the plurality of spacers includes:

forming a plurality of units over the base material, wherein each of the plurality of units includes an under layer (UL) and a hard mask (HM) on the under layer (UL);

forming a cover layer to cover the units, wherein the cover layer includes a plurality of first portions disposed on top surfaces of the plurality of units, a plurality of second portions disposed on lateral surfaces of the plurality of units, and a plurality of third portions connecting the plurality of second portions;

forming an upper material to cover the cover layer;

removing the upper material and the plurality of first portions of the cover layer;

removing the hard mask (HM) and the plurality of third portions of the cover layer; and removing the under layer (UL) to form the plurality of spacers;

wherein removing the hard mask (HM) and the plurality of third portions includes:

removing the hard mask (HM) and the plurality of third portions of the cover layer by using an etching gas; and removing an upper portion of the under layer (UL) and an upper portion of each of the plurality of second portions of the cover layer to form a remaining portion of the under layer (UL) and the plurality of spacers, wherein the etching gas and the upper portion of the under layer (UL) react to form a polymer to protect the plurality of spacers.

11. The method of claim 10, further comprising:

removing the plurality of spacers.

12. The method of claim 10, wherein removing the upper material and the plurality of first portions of the cover layer includes:

removing a portion of the upper material to remain a remaining portion of the upper material disposed in a gap between the units, wherein the plurality of first portions of the cover layer are exposed from the remaining portion of the upper material; and removing the plurality of first portions of the cover layer and a portion of the hard mask (HM).

13. The method of claim 10 wherein removing the under layer (UL) to form the plurality of spacers includes:

stripping the under layer (UL) to remain the plurality of spacers standing over the base material.

14. The method of claim 10, wherein a top surface of the remaining portion of the under layer (UL) and top surfaces of the plurality of spacers are substantially coplanar with each other.

15. The method of claim 10, wherein a sacrificial layer is disposed between the plurality of units and the base material, wherein after removing the under layer (UL) to form the plurality of spacers, the method further includes:

removing a plurality of portions of the sacrificial layer that are not covered by the plurality of spacers.

* * * * *